(12) United States Patent
Hwang et al.

(10) Patent No.: US 9,559,723 B2
(45) Date of Patent: Jan. 31, 2017

(54) TRANSMITTING APPARATUS, RECEIVING APPARATUS, AND CONTROLS METHOD THEREOF

(71) Applicant: SAMSUNG ELECTRONICS CO., LTD., Suwon-si (KR)

(72) Inventors: Sung-hee Hwang, Suwon-si (KR); Hyun-koo Yang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 108 days.

(21) Appl. No.: 14/498,408

(22) Filed: Sep. 26, 2014

(65) Prior Publication Data

US 2015/0095745 A1 Apr. 2, 2015

(30) Foreign Application Priority Data

Sep. 27, 2013 (KR) ........................ 10-2013-0114921

(51) Int. Cl.
| | | |
|---|---|---|
| *H03M 13/00* | (2006.01) | |
| *H03M 13/27* | (2006.01) | |
| *H03M 13/25* | (2006.01) | |
| *H04L 1/00* | (2006.01) | |
| *H03M 13/11* | (2006.01) | |

(Continued)

(52) U.S. Cl.
CPC ....... *H03M 13/2792* (2013.01); *H03M 13/255* (2013.01); *H03M 13/271* (2013.01); *H03M 13/2707* (2013.01); *H04L 1/00* (2013.01); *H03M 13/1102* (2013.01); *H03M 13/152* (2013.01); *H03M 13/2906* (2013.01)

(58) Field of Classification Search
None
See application file for complete search history.

(56) References Cited

U.S. PATENT DOCUMENTS

| | | | |
|---|---|---|---|
| 9,009,775 B2* | 4/2015 | Ko ..................... | H03M 13/251 725/146 |
| 2010/0061465 A1* | 3/2010 | Limberg ................. | H04N 5/46 375/240.27 |
| 2010/0329232 A1 | 12/2010 | Tubb et al. | |

(Continued)

FOREIGN PATENT DOCUMENTS

EP  2541907 A2  1/2013

OTHER PUBLICATIONS

Written Opinion issued on Dec. 30, 2014 by the International Searching Authority in related application No. PCT/KR2014/008999.

(Continued)

*Primary Examiner* — Daniel McMahon
(74) *Attorney, Agent, or Firm* — Sughrue Mion, PLLC

(57) ABSTRACT

Provided are apparatuses and methods for generating and transmitting transmission frames of information data. A transmitting apparatus includes: a stream processor configured to generate a plurality of baseband frames; a frame generator configured to generate, from the plurality of baseband frames, a plurality of transmission frames which includes information data commonly provided to a fixed device and a mobile device, first parities to be used for signal processing at the fixed device, and second parities to be used for signal processing at the mobile device; and a transmitter configured to transmit the plurality of transmission frames.

20 Claims, 20 Drawing Sheets

(51) Int. Cl.
    *H03M 13/15*     (2006.01)
    *H03M 13/29*     (2006.01)

(56) References Cited

U.S. PATENT DOCUMENTS

| | | |
|---|---|---|
| 2011/0002378 A1 | 1/2011 | Raveendran |
| 2011/0090879 A1 | 4/2011 | Hamiti et al. |
| 2013/0003819 A1 | 1/2013 | Kisoda et al. |
| 2014/0126672 A1* | 5/2014 | Petrov ................ H03M 13/1165 375/298 |
| 2014/0161209 A1* | 6/2014 | Limberg ............... H04L 5/0016 375/299 |
| 2015/0010103 A1* | 1/2015 | Murakami ............ H04L 1/0003 375/267 |

OTHER PUBLICATIONS

Search Report issued on Dec. 30, 2014 by the International Searching Authority in related application No. PCT/KR2014/008999.

\* cited by examiner

200

TRANSMITTING APPARATUS, RECEIVING APPARATUS, AND CONTROLS METHOD THEREOF

CROSS-REFERENCE TO RELATED APPLICATION

This application claims priority from Korean Patent Application No. 10-2013-0114921, filed on Sep. 27, 2013, in the Korean Intellectual Property Office, the disclosure of which is incorporated herein in its entirety by reference.

BACKGROUND

1. Field

Apparatuses and methods consistent with exemplary embodiments relate to transmitting and receiving information data commonly provided to a fixed device and a mobile device.

2. Description of the Related Art

Existing terrestrial broadcasting physical standard groups (e.g. digital video broadcasting (DVB) or advanced television system committee (ATSC)) are directed to broadcasting a variety of services to fixed devices (e.g. smart televisions (TVs) or set top boxes in home) or mobile devices (e.g. smart phones).

With development of mobile networks and supply expansion of mobile devices, the need for enhancing terrestrial broadcasting physical standards covering mobile broadcasting is rising. High definition (HD) content services which can be received only at TVs in home need to be received at mobile devices with development of network and display technologies.

In general, a channel environment for broadcasting to fixed devices is better than a channel environment for broadcasting to mobile devices. Since a quality of received service data is changed according to a location of a mobile device due to its mobility, and moving speed and a reception environment while the mobile device is moving are changed, channel distortion is more serious in a channel for the mobile device than in a channel for a fixed device.

Therefore, when service data is transmitted through the channel for the fixed device, a desired data quality is ensured through control of a parity data amount. In contrast, when service data is transmitted through the channel for the mobile device, it is an effective way to overcome the serious channel distortion by obtaining a time diversity by interleaving forward error correction (FEC) words.

Since the Fixed and Mobile Common Service (FAMCOS) considers service data reception at both fixed devices and mobile devices, channel environments for both types of device have to be considered when service data for the FAMCOS is to be encoded and transmitted. When service data is FEC-coded considering a relatively inferior channel environment for mobile devices, mobile devices as well as fixed devices may receive a desired quality of service data.

However, as described above, since the channel distortion is serious in the channel environment for mobile devices, interleaving with a long duration has to be performed while such interleaving with a long duration is not necessary for the channel environment for fixed devices.

Therefore, a delay by a long duration for the channel environment for mobile devices is considered when both types of device are used. However, such delay is unnecessary when only the channel environment for fixed devices is considered. That is, since fixed devices are situated in the channel environment relatively better than mobile devices, the same delay required in the channel environment for mobile devices is not necessary in serving for the channel environment for fixed devices, and a delay smaller than that required in the channel environment for mobile devices may be sufficient.

Thus, there is a need for a method for simultaneously obtaining a small delay and a time diversity gain by simultaneously considering fixed devices and mobile devices.

SUMMARY

One or more exemplary embodiments may overcome the above disadvantages and other disadvantages not described above. However, it is understood that one or more exemplary embodiment are not required to overcome the disadvantages described above, and may not overcome any of the problems described above.

One or more exemplary embodiments provide a transmitting apparatus, a receiving apparatus and methods controlling these apparatuses. The transmitting apparatus may transmit and the receiving apparatus may receive information data commonly provided to a fixed device and a mobile device, first parities to be used for signal processing at the fixed device or at both the fixed device and a mobile device, and second parities to be used for signal processing at the mobile device.

According to an aspect of an exemplary embodiment, there is provided a transmitting apparatus. The transmitting apparatus may include: a stream processor configured to generate a plurality of baseband frames; a frame generator configured to generate, from the plurality of baseband frames, a plurality of transmission frames which comprise information data commonly provided to a fixed device and a mobile device, first parities to be used for signal processing at the fixed device, and second parities to be used for signal processing at the mobile device; and a transmitter configured to transmit the plurality of transmission frames.

The frame generator may generate the first parities with respect to the information data included in each of the plurality of transmission frames, and generate the second parities with respect to all of the information data included in the plurality of transmission frames, so that the first parities are included in each of the plurality of transmission streams, and portions of the second parities are respectively included in the plurality of transmission frames.

The transmitting apparatus may further include a bit interleaved coded modulation (BICM) encoder configured to generate the information data, the first parities and the second parities by performing FEC coding on the plurality of baseband frames, first interleaving on a result of the first FEC coding, second FEC coding on a result of the first interleaving, and performing second interleaving on a result of the second FEC coding.

The BICM encoder may perform the first interleaving in a first interleaving unit and perform the second interleaving in the second interleaving unit. The first interleaving unit may be smaller than the second interleaving unit. The first interleaving unit may be one transmission frame, and the second interleaving unit may be all of the plurality of transmission frames.

The BICM encoder may perform first forward error correction (FEC) coding on the plurality of baseband frames to generate the information data and the first parities, interleave a result of the first FEC coding including the information data and the first parities in a first interleaving unit, rearrange an order of the interleaved information data to generate shuffled information data, perform second FEC coding on the shuffled information data to generate the second parities, and interleave a result of the second FEC coding including the shuffled information data and the second parities in a second interleaving unit.

The plurality of transmission frames may include a preamble symbol which includes information about locations of the information data, the first parities and the second parities in the plurality of transmission frames, information about the FEC coding and information about the interleaving.

According to an aspect of an exemplary embodiment, there is provided a receiving apparatus. The receiving apparatus may include: a receiver configured to receive a plurality of transmission frames which include information data commonly provided to a fixed device and a mobile device, first parities to be used for signal processing at the fixed device, and second parities to be used for signal processing at the mobile device; and a signal processor configured to perform signal processing on the plurality of transmission frames using the first parities or the second parities.

For the signal processing, the signal processor may use the first parities to decode the plurality of transmission frames in a unit of one transmission frame, and use the second parities to decode the plurality of transmission frames in a unit of all of the plurality of transmission frames.

The plurality of transmission frames may further include a preamble symbol which include information about coding and interleaving through which the information data, the first parities and the second parities are generated, and the signal processor may perform the signal processing using this information about the coding and interleaving.

The receiving apparatus may be a fixed device. Then, the signal processor may perform signal processing on each of the plurality of transmission frames using the first parities generated with respect to the information data included in each of the plurality of transmission frames.

The receiving apparatus may be a mobile device. Then, the signal processor may perform signal processing on the plurality of transmission frames using the second parities generated with respect to all of the information data included in the plurality of transmission frames.

If the receiving apparatus is a fixed device, the signal processor may perform deinterleaving on the plurality of transmission frames in a unit of one transmission frame, and decoding on a result of the deinterleaving based on information about coding which has generated the first parities. If the receiving device is a mobile device, the signal processor may perform deinterleaving on the plurality of transmission frames in a unit of all of the plurality of transmission frames, and decoding on a result of the deinterleaving based on information about coding which has generated the second parities. Further, the signal processor may perform deinterleaving on the plurality of transmission frames in a unit of one transmission frame and decoding on a result of the deinterleaving based on information about coding which has generated the first parities, after the deinterleaving on the plurality of transmission frames in a unit of all of the plurality of transmission frames and the decoding on a result of the deinterleaving based on information about coding which has generated the second parities.

According to an aspect of an exemplary embodiment, there is provided a method of controlling a transmitting apparatus. The method may include: generating a plurality of baseband frames; generating, from the plurality of baseband frames, a plurality of transmission frames which comprise information data commonly provided to a fixed device and a mobile device, first parities to be used for signal processing at the fixed device, and second parities to be used for signal processing at the mobile device; and transmitting the plurality of transmission frames.

The method may further include generating the first parities with respect to the information data included in each of the plurality of transmission frames, and generating the second parities with respect to all of the information data included in the plurality of transmission frames, so that the first parities are included in each of the plurality of transmission streams, and portions of the second parities are respectively included in the plurality of transmission frames.

The information data, the first parities and the second parities may be generated by performing FEC coding on the plurality of baseband frames, first interleaving on a result of the first FEC coding, second FEC coding on a result of the first interleaving, and performing second interleaving on a result of the second FEC coding.

The first interleaving may be performed in a first interleaving unit and the second interleaving may be performed in a second interleaving unit, and the first interleaving unit may be smaller than the second interleaving unit.

The generating the plurality of transmission frames may include performing first forward error correction (FEC) coding on the plurality of baseband frames to generate the information data and the first parities; interleaving a result of the first FEC coding including the information data and the first parities in a first interleaving unit; rearranging an order of the interleaved information data to generate shuffled information data; performing second FEC coding on the shuffled information data to generate the second parities; and interleaving a result of the second FEC coding including the shuffled information data and the second parities in a second interleaving unit.

The plurality of transmission frames may include a preamble symbol which includes information about locations of the information data, the first parities and the second parities in the plurality of transmission frames, information about the FEC coding and information about the interleaving.

According to an aspect of an exemplary embodiment, there is provided a method of controlling a receiving apparatus. The method may include: receiving a plurality of transmission frames which comprise information data commonly provided to a fixed device and a mobile device, first parities to be used for signal processing at the fixed device, and second parities to be used for signal processing at the mobile device; and performing signal processing on the plurality of transmission frames using at least one of the first parities and the second parities.

In the signal processing, the first parities may be used to decode the plurality of transmission frames in a unit of one transmission frame, and the second parities may be used to decode the plurality of transmission frames in a unit of all of the plurality of transmission frames.

The plurality of transmission frames may further include a preamble symbol comprising information about coding and interleaving through which the information data, the first parities and the second parities are generated, and the signal processing is performed by using this information about the coding and interleaving.

The performing signal processing on the plurality of transmission frames may include: performing signal processing on each of the plurality of transmission frames using the first parities generated with respect to the information data part included in each of the plurality of transmission frames, if the receiving apparatus is a fixed device; and performing signal processing on all of the plurality of transmission frames using the second parities generated with respect to all of the information data included in the plurality of transmission frames, if the receiving apparatus is a mobile device. If the receiving apparatus is a mobile device, the performing signal processing on the plurality of transmission frames may further include performing signal processing on each of the plurality of transmission frames using the first parities generated with respect to the information data included in each of the plurality of transmission frames, prior to performing the signal processing on all of the plurality of transmission frames using the second parities The performing signal processing on the plurality of transmission frames may include: performing deinterleaving on the plurality of transmission frames in a unit of one transmission frame, and decoding on a result of the deinterleaving based on information about coding which has generated the first parities, if the receiving apparatus is a fixed device; and performing deinterleaving on the plurality of transmission frames in a unit of all of the plurality of transmission frames, and decoding on a result of the deinterleaving based on information about coding which has generated the second parities if the receiving apparatus is a mobile device.

If the receiving apparatus is a mobile device, the performing signal processing on the plurality of transmission frames may further include performing the deinterleaving on the plurality of transmission frames in a unit of one transmission frame and the decoding on a result of the deinterleaving based on information about coding which has generated the first parities, after performing the deinterleaving on the plurality of transmission frames in a unit of all of the plurality of transmission frames and the decoding on a result of the deinterleaving based on information about coding which has generated the second parities.

According to the above aspects of the various exemplary embodiments, a delay in interleaving/deinterleaving may be reduced to support a fixed device, and simultaneously a time diversity gain may be obtained to support a mobile device.

Additional aspects and advantages of the exemplary embodiments will be set forth in the detailed description, will be obvious from the detailed description, or may be learned by practicing the exemplary embodiments.

BRIEF DESCRIPTION OF THE DRAWING FIGURES

The above and/or other aspects will be more apparent by describing exemplary embodiments of the inventive concept in detail, with reference to the accompanying drawings, in which.

DETAILED DESCRIPTION OF THE EXEMPLARY EMBODIMENTS

Figure 1A:
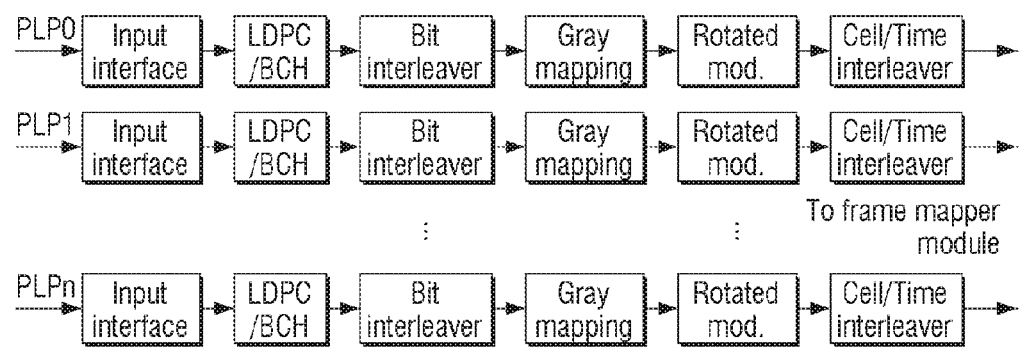
FIGS. 1A and 1B illustrate a Digital Video Broadcasting-Second Generation Terrestrial (DVB-T2) and a frame structure transmitted through the DVB-T2 provided for understanding an inventive concept.

Hereinafter, exemplary embodiments of the inventive concept will be described in more detail with reference to the accompanying drawings.

In the following description, the same reference numerals are used for the same elements when they are depicted in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiments with unnecessary detail.

Figure 1B:
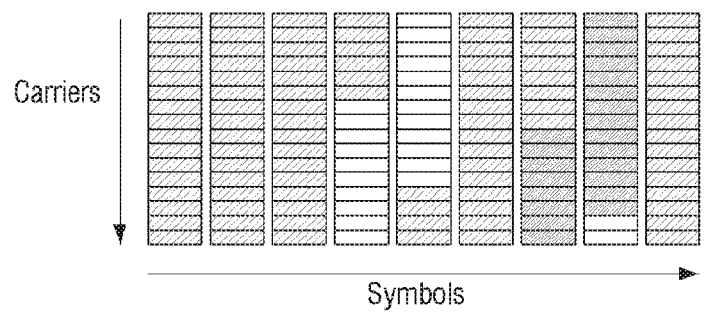

FIGS. 1A and 1B illustrate a Digital Video Broadcasting-Second Generation Terrestrial (DVB-T2) system and a frame structure transmitted through the DVB-T2 system provided for understanding an inventive concept.

Unlike a Digital Video Broadcasting-Terrestrial (DVB-T), the DVB-T2 system applies a physical layer pipe (PLP) concept to provide a variety of broadcasting services (for example, video, extended video, audio, a data stream, or the like) having different modulation methods, channel coding rates, times and cell interleaving lengths, or the like through one broadcasting channel as illustrated in a PLP concept diagram of FIG. 1A.

A PLP means a signal path which is processed independently from another PLP. That is, a variety of services may be transmitted and received through a plurality of radio frequency (RF) channels, and a PLP is a path through which one or more of these services are transmitted and received, or a stream which is transmitted through the path. Further, the PLP may be located in slots distributed with time intervals on the plurality of RF channels, or the PLP may be distributed on one RF channel with time intervals. That is, the PLP may be distributed on the one RF channel or the plurality of RF channels with time intervals and transmitted.

The PLP structure is configured of an input mode A for providing one PLP and an input mode B for providing a plurality of PLPs. When the input mode B is supported, the PLP may robustly provide a service, and also distribute and transmit one stream as illustrated in FIG. 1B. Thus a time interleaving length may be increased and a time diversity gain may be obtained. Further, when reception of only a specific stream is desired, a receiving apparatus may be powered off during the time of receiving other streams, and thus, the receiving apparatus may be used with low power during the time of receiving other streams. Accordingly, the input mode B may be suitable for mobile broadcasting services.

The time diversity is technology for obtaining a good transmission and reception quality by transmitting the same signal several times with predetermined time intervals at a transmission side to reduce deterioration of a transmission quality in a mobile communication channel, and mixing the received signals, which are the same, at a reception side.

Information to be commonly transmitted through a plurality of PLPs may be included in one PLP and transmitted to increase a transmission efficiency. PLP0 illustrated in FIG. 1A performs the above-described functions, and is called a common PLP. The remaining PLPs other than PLP0 may be used to transmit data, and these PLPs are called data PLPs.

By using this PLP structure, a high definition television (HDTV) service and a standard definition television (SDTV) service for a same program may be provided to a fixed device and a mobile device, respectively. Further, a variety of broadcasting services may be provided from a broadcasting station or a broadcasting content provider. Also, it may be possible to provide viewers in a fringe area with differentiated broadcasting services.

Figure 2:
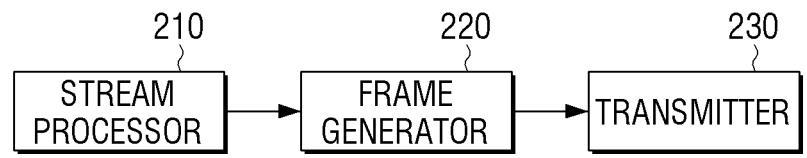
FIG. 2 is a block diagram illustrating a configuration of a transmitting apparatus according to an exemplary embodiment.

FIG. 2 is a block diagram illustrating a configuration of a transmitting apparatus according to an exemplary embodiment.

Referring to FIG. 2, a transmitting apparatus 200 may include a stream processor 210, a frame generator 220, and a transmitter 230.

The transmitting apparatus 200 may transmit, to a receiving apparatus (not shown), data which includes information data commonly provided to a fixed device and a mobile device, first parities, and second parities. For example, the fixed device may be, a smart TV or a set top box, and the mobile device may be a smart phone.

When a data stream is input, the stream processor 210 may generate a plurality of baseband frames by inserting a header into the data stream.

Specifically, the stream processor 210 may divide the input data stream into data fields each of which is a data unit for first forward error correction (FEC) coding, and add a baseband header to a data field to generate a baseband frame.

The frame generator 220 may generate a plurality of transmission frames which includes the information data commonly provided to the fixed device and the mobile device, the first parities for the fixed device or both the fixed device and the mobile device, and the second parities for the mobile device from the plurality of baseband frames. Here, the first parities and second parities may be generated only for the fixed device and the mobile device, respectively.

Figure 3:
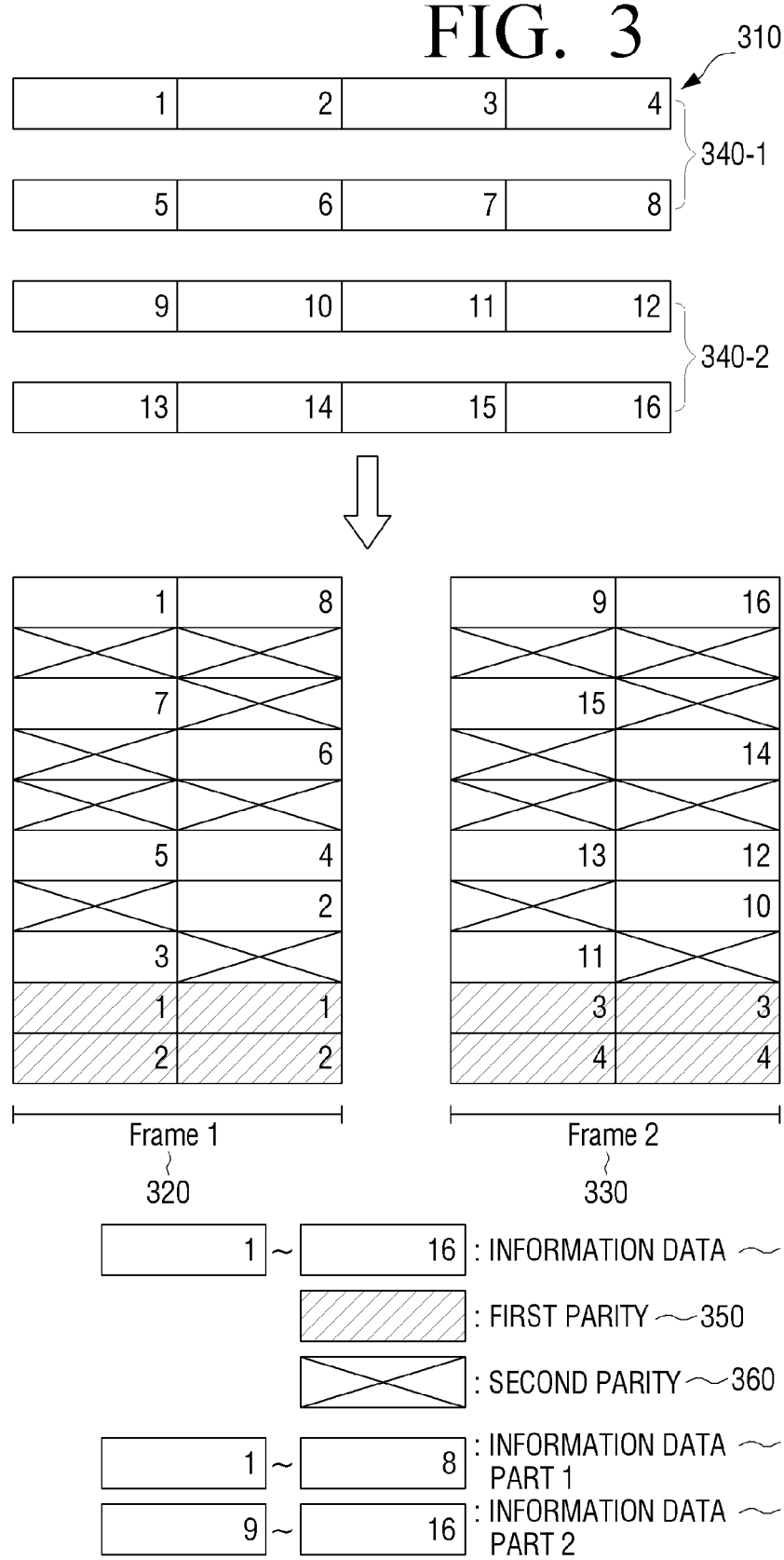
FIG. 3 is a view illustrating a plurality of transmission frames including information data, a first parity, and a second parity according to an exemplary embodiment.

FIG. 3 is a view illustrating a plurality of transmission frames which includes the information data, the first parities, and the second parities, according to an exemplary embodiment. The plurality of transmission frames may be generated at the frame generator 220 of FIG. 2.

Referring to FIG. 3, a plurality of baseband frames 310 may be processed in two transmission frames 320 and 330 which include information data 1 to 16 340, first parities 350, and second parities 360. Detailed descriptions about processing the plurality of baseband frames 310 in the plurality of transmission frames 320 and 330 will be described later. Here, although the number of the transmission frames 320 and 330 is two, more than two transmission frames may be generated to process the plurality of baseband frames 310 according to another exemplary embodiment.

That is, when the plurality of baseband frames 310 are input, the frame generator 220 may process the plurality of input baseband frames 310, and generate the plurality of transmission frames 320 and 330 which include the information data 340 commonly provided to the fixed device and the mobile device, the first parities 350, and the second parities 360.

The first parities 350 may be used to decode the information data 340 received at the fixed device and/or the mobile device, and the second parities 360 may be used to decode the information data 340 received at the mobile device.

Each of the plurality of transmission frames may include the first parities corresponding to an information data part included in each of the plurality of transmission frames and a portion of the second parities corresponding to all (or entirety) of the information data included in the plurality of transmission frames.

Specifically, the information data 340 commonly provided to the fixed device and the mobile device may be dispersedly included in the transmission frame 1 320 and transmission frame 2 330, 1 and 2 of the first parities 350 are included in the transmission frame 1 320, and 3 and 4 of the first parities 350 are included in the transmission frame 2 330. The second parities 360 are dispersedly included in the transmission frame 1 320 and the transmission frame 2 330.

Therefore, the transmission frame 1 320 may include a portion of the information data 340 (hereinafter referred to as information data part 1 340-1) commonly provided to the fixed device and the mobile device, 1 and 2 of the first parities 350 generated with respect to the information data part 1 340-1, and a portion of the second parities 360 generated with respect to all of the information data 340.

The transmission frame 2 330 may include a portion of the information data 340 (hereinafter referred to as information data part 2 340-2) commonly provided to the fixed device and the mobile device, 3 and 4 of the first parities 350 generated with respect to the information data part 2 340-2, and a portion of the second parities 360 generated with respect to the whole information data 340.

Therefore, the frame generator 220 may generate the plurality of transmission frames 320 and 330 in which the first parities 350 and the second parities 360 are added to the information data 340 which is commonly used in the fixed device and the mobile device.

The information data part included in each of a plurality of transmission frames has a first time diversity gain with respect to the first parities for each of the plurality of transmission frames, and all of the information data included in the plurality of transmission frames has a second time diversity gain with respect to the second parities for all of the plurality of transmission frames.

Specifically, information data 1 to 8 may be included in the transmission frame 1 320 as the information data part 1 340-1, and information data 9 to 16 may be included in the transmission frame 2 330 as the information data part 2 340-2.

1 and 2 of the first parities 350 are generated and added to the information data part 1 340-1, and 3 and 4 of the first parities 350 are generated and added to the information data part 2 340-2.

Therefore, the information data part 1 340-1 included in the transmission frame 1 320 may have the first time diversity gain with respect to 1 and 2 of the first parities 350, and the information data part 2 340-2 included in the frame 2 330 may have the first time diversity gain with respect to 3 and 4 of the first parities 350.

Specifically, the information data part 1 340-1 is interleaved to have the first time diversity gain in a section of the transmission frame 1 320, and thus an order is rearranged, and the information data part 2 340-2 is interleaved to have the first time diversity gain in a section of the transmission frame 2 330, and thus an order is rearranged.

Therefore, when a receiving apparatus (not shown) receives the transmission frame 1 320, the receiving apparatus may decode the information data part 1 using 1 and 2 of the first parities 350 to obtain the information data part 1 340-1. When the receiving apparatus (not shown) receives the transmission frame 2 330, the receiving apparatus may decode the information data part 2 using 3 and 4 of the first parities 350 to obtain the information data part 2 340-2.

The time diversity gain has been already explained above, and thus detailed descriptions thereof will be omitted.

All of the information data 1 to 16 340 included in the transmission frames 1 and 2 320 and 330 may have the second time diversity gain with respect to the second parities 360 included in the transmission frames 1 and 2 320 and 330, and thus the information data 340 may have the second time diversity gain for all of the transmission frames 1 and 2 320 and 330.

Specifically, the information data 1 to 16 340 is interleaved to have the second time diversity gain for all of the transmission frames 1 and 2 320 and 330, and thus an order is rearranged.

Therefore, when the information data 1 to 16 340 is received, a receiving apparatus (not shown) may decode the information data 1 to 16 340 using the second parities 360 to obtain the frame 1 and 2 320 and 330.

That is, the receiving apparatus (not shown) may decode the received information data part 1 or 2 340-1 or 340-2 or the information data 340 selectively using the first parities or the second parities, respectively, and thus the receiving apparatus may selectively acquire the first time diversity gain or the second time diversity gain. Detailed descriptions thereof will be described later.

The transmitter 230 may transmit the plurality of transmission frames.

As described above, the plurality of transmission frames may include the information data 340 commonly provided to the fixed device and the mobile device, the first parities 350 for the fixed device, and the second parities 360 for the mobile device.

The transmitting apparatus 200 of FIG. 2 may further include a bit interleaved coded modulation (BICM) encoder, separately from the stream processor 210 and the frame generator 220 or as a component of one of the stream processor 210 or the frame generator 220, according to an exemplary embodiment.

Figure 4:
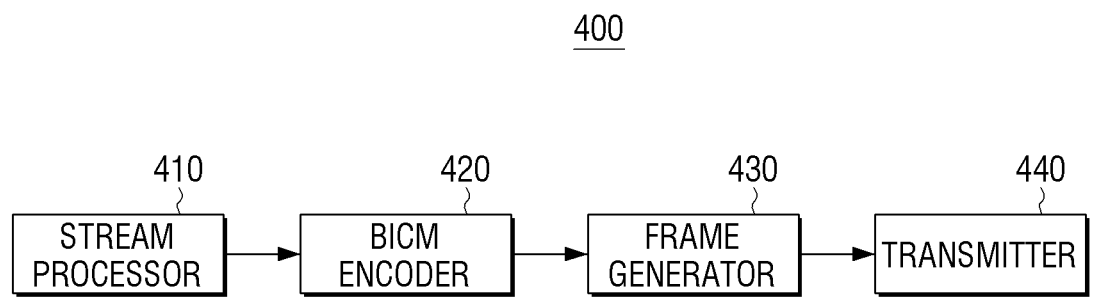
FIG. 4 is a block diagram illustrating a configuration of a transmitting apparatus according to another exemplary embodiment.

FIG. 4 is a block diagram illustrating a configuration of a transmitting apparatus according to another exemplary embodiment.

Referring to FIG. 4, a transmitting apparatus 400 may include a stream processor 410, a BICM encoder 420, a frame generator 430, and a transmitter 440.

The stream processor 410, the frame generator 430, and the transmitter 440 have been already described above, and detailed descriptions thereof will be omitted. However, the BICM encoder 420 may be implemented as a component of the stream processor 410 or the frame generator 430, as described above.

The BICM encoder 420 may generate first parities and second parities by performing first FEC coding and second FEC coding on a plurality of baseband frames for a fixed device and/or a mobile device, and perform interleaving on results of the first FEC coding and/or the second FEC coding.

The first FEC coding and the second FEC coding are performed separately from each other. Detailed descriptions thereof will be described with reference to FIGS. 5 and 6.

Figure 5:
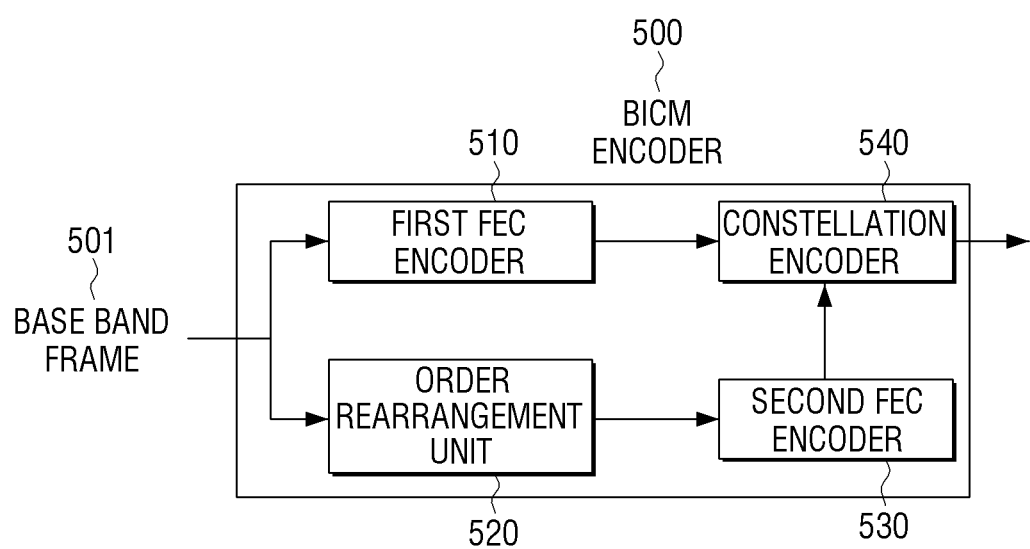
FIG. 5 is a detailed block diagram illustrating a BICM encoder according to an exemplary embodiment.

FIG. 5 is a detailed block diagram illustrating a BICM encoder according to an exemplary embodiment.

Referring to FIG. 5, a BICM encoder 500 may include a first FEC encoder 510, an order rearrangement unit 520, a second FEC encoder 530, and a constellation encoder 540. The BICM encoder 500 may be the same as the BICM encoder 420 shown in FIG. 4.

Although not shown in FIG. 5, a plurality of baseband frames 501 input to the BICM encoder 500 may be frames generated at a stream processor, such as the stream processor 410 shown in FIG. 4, according to a first FEC coding parameter for performing the first FEC coding. When the plurality of baseband frames 501 are input, the first FEC encoder 510 may perform the first FEC coding on the plurality of baseband frames 501 for the fixed device.

The plurality of baseband frames 501 are also input to the order rearrangement unit 520 which rearranges an order of the input baseband frames 501 and generates a plurality of baseband frames according to a second FEC coding parameter for performing the second FEC coding.

The plurality of baseband frames 501 generated according to the first FEC coding parameter may be different from the plurality of baseband frames generated according to the second FEC coding parameter.

The second FEC encoder 530 may perform the second FEC coding, for the mobile device, on the plurality of baseband frames, of which the order is rearranged and which are generated according to the second FEC coding parameter.

The order rearrangement unit 520 is configured to rearrange the order of information data of the baseband frames 501, and the order rearrangement may achieve an effect similar to an interleaving effect.

The constellation encoder 540 may generate a cell by performing quadrature amplitude modulation (QAM) encoding through a QAM encoder (not shown) on the information data and first parities output from the first FEC encoder 510 and second parities output from the second FEC encoder 530.

Alternatively, the constellation encoder 540 may generate a cell by performing QAM encoding through the QAM encoder on the first parities output from the first FEC encoder 510 and the information data and the second parities output from the second FEC encoder 530.

That is, since the information data output from the first FEC encoder 510 has the same format as the information data output from the second FEC encoder 530, the constellation encoder 540 may generate the cell by performing QAM encoding on one of the information data output from the first FEC encoder and the information data output from the second FEC encoder through the QAM encoder.

Figure 6:
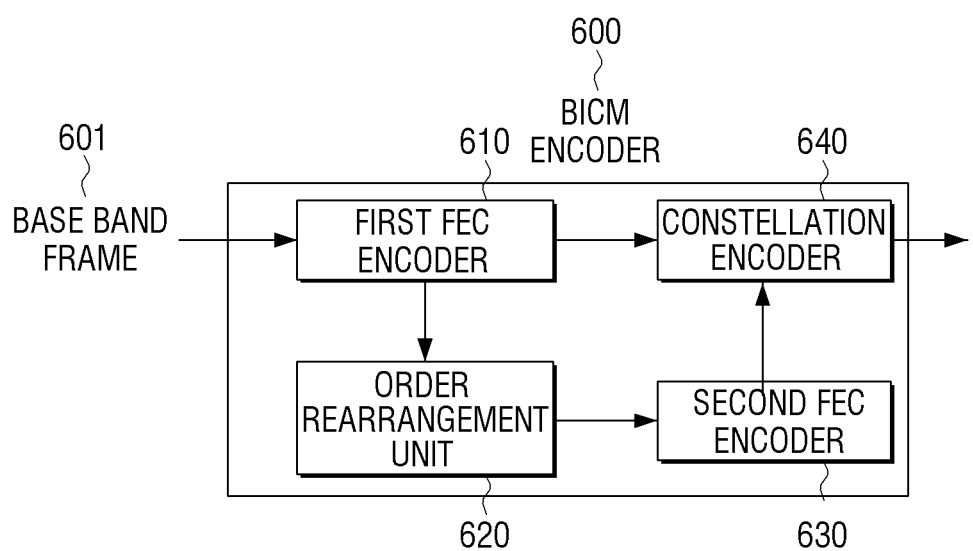
FIG. 6 is a detailed block diagram illustrating a BICM encoder according to another exemplary embodiment.

FIG. 6 is a detailed block diagram illustrating a BICM encoder according to another exemplary embodiment.

Referring to FIG. 6, a BICM encoder 600 may include a first FEC encoder 610, an order rearrangement unit 620, a second FEC encoder 630, and a constellation encoder 640.

The BICM encoder 600 may be the same as the BICM encoder 420 shown in FIG. 4.

Although not shown in FIG. 6, a plurality of baseband frames 601 input to the BICM encoder 600 may be frames generated at a stream processor, such as the stream processor 410 shown in FIG. 4, according to a first FEC coding parameter for performing the first FEC coding. When the plurality of baseband frames 601 are input, the first FEC encoder 610 may perform the first FEC coding on the plurality of baseband frames 601.

The order rearrangement unit 620 may rearrange orders of the information data 601 and the first parities output from the first FEC encoder 610, and generate a plurality of baseband frames according to a second FEC coding parameter for performing the second FEC coding.

The plurality of baseband frames 601 generated according to the first FEC coding parameter may be different from the plurality of baseband frames generated according to the second FEC coding parameter.

The second FEC encoder 630 may perform the second FEC coding, for the mobile device, on the plurality of baseband frames generated according to the second FEC coding parameter through the order rearrangement of the information data and the first parities output from the first FEC encoder 610.

The order rearrangement unit 620 is configured to rearrange an order of information data of the baseband frames 601 generated according to the first FEC coding parameter, and the order rearrangement may achieve an effect similar to an interleaving effect.

The constellation encoder 640 may generate a cell by performing QAM encoding through a QAM encoder on the information data and the first parities output from the first FEC encoder 610 and the second parities output from the second FEC encoder 630.

Alternatively, the constellation encoder 640 may generate a cell by performing QAM encoding through the QAM encoder on the first parities output from the first FEC encoder 610 and the information data and the second parities output from the second FEC encoder 630.

That is, since the information data output from the first FEC encoder 610 has the same format as the information data output from the second FEC encoder 630, the constellation encoder 640 may generate the cell by performing QAM encoding on one of the information data output from the first FEC encoder and the information data output from the second FEC encoder through the QAM encoder.

As described above, the BICM encoders 500 and 600 may perform the second FEC coding on a plurality of baseband frames which are not processed at the first FEC encoder 510, or may perform the second FEC coding on a plurality of baseband frames which have been processed at the first FEC encoder 610. A frame processing process related thereto will be described with reference to FIGS. 7 to 9.

Figure 7:
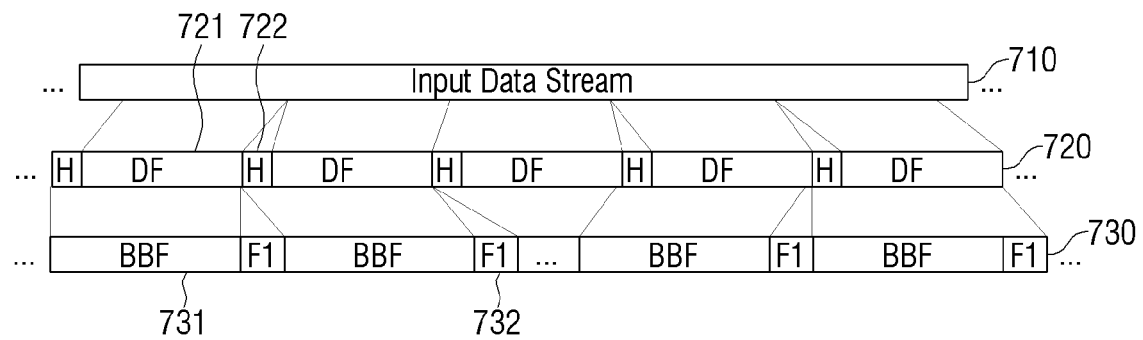
FIG. 7 is a view illustrating a frame processing process of a first FEC encoder according to an exemplary embodiment.

FIG. 7 illustrates a structure of baseband frames processed at a first FEC encoder in reference to FIGS. 4-6, according to an exemplary embodiment. Here, the first FEC encoder may be the first FEC encoder 510 or 610 shown in FIG. 5 or FIG. 6, respectively.

Referring to FIG. 7, when a data stream 710 is input, the stream processor 410 shown in FIG. 4 may generate a plurality of baseband frames 720 by dividing the data stream 710 into data fields 721 configured in a certain size according to the first FEC coding parameter, and inserting the baseband heater 722 into the data field 721.

The plurality of baseband frames 720 may be generated according to the first FEC coding parameter for performing the first FEC coding.

Therefore, the first FEC encoder 510 may perform the first FEC coding on the plurality of baseband frames 720 to generate a stream 730 which includes a plurality of baseband frames 731 (hereinafter referred to as information data) and first parities 732.

Figure 8:
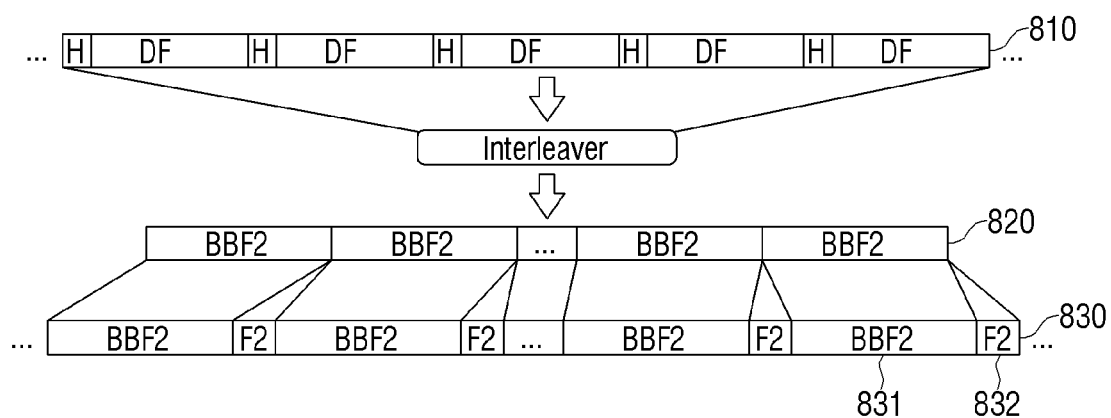
FIGS. 8 and 9 are views illustrating frame processing processes of a second FEC encoder according to various exemplary embodiments.
Figure 9:
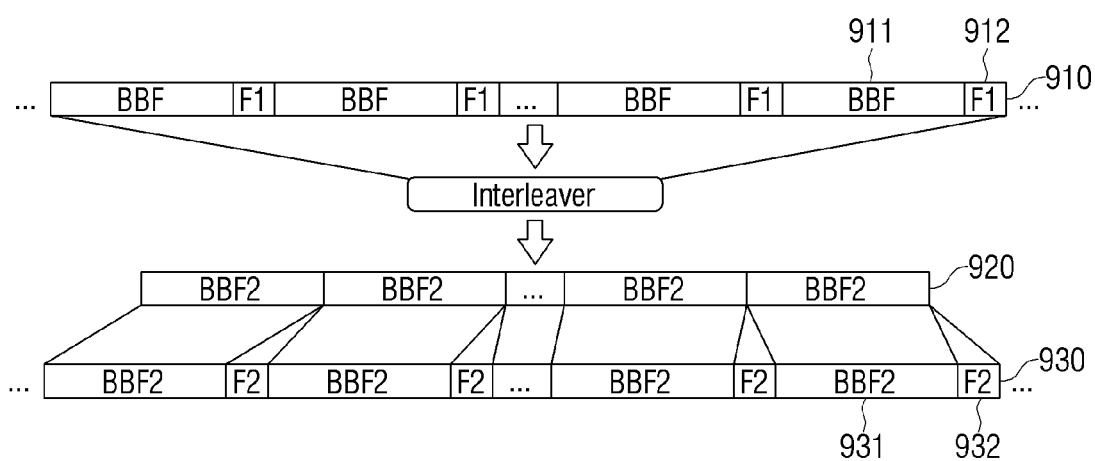

FIGS. 8 and 9 illustrate a structure of baseband frames processed at a second FEC encoder in reference to FIGS. 4-6, according to various exemplary embodiments. Here, the second FEC encoder may be the second FEC encoder 530 or 630 shown in FIG. 5 or FIG. 6, respectively Referring to FIG. 8, the order rearrangement unit 520 may generate baseband frames 820 for the second FEC coding by rearranging an order of baseband frames 810 which are generated at the stream processor 410 shown in FIG. 4 according to the first FEC coding parameter for performing the first FEC coding.

The second FEC encoder 530 may perform the second FEC coding on the baseband frames 820 to generate a stream 830 which includes a plurality of baseband frames 831 and the second parities 832.

Referring to FIG. 9, the order rearrangement unit 620 may generate baseband frames 920 for the second FEC coding by rearranging an order of a plurality of baseband frames 911 and first parities 912 generated by performing the first FEC coding on a stream 910 according to the first FEC coding parameter at the FEC encoder 510, as illustrated in FIG. 7.

The second FEC encoder 630 may perform the second FEC coding on the plurality of baseband frames 920 for performing the second FEC coding to generate a stream 930 which includes the plurality of baseband frames 931 and the second parities 932.

The BICM encoder 420, 500 or 600 (hereinafter referred to as the BICM encoder) may perform interleaving on the plurality of baseband frames after the first FEC coding and/or the second FEC coding are performed on the plurality of baseband frames.

Specifically, the BICM encoder may perform interleaving on the plurality of baseband frames on which the first FEC coding is performed in a first interleaving unit to obtain a first time diversity gain. Next, the BICM encoder may perform interleaving on the plurality of baseband frames on which the second FEC coding is performed in a second interleaving unit to obtain a second time diversity gain.

As described above, the information data part included in each of a plurality of transmission frames has a first time diversity gain with respect to the first parities for each of the plurality of transmission frames, and all of the information data included in the plurality of transmission frames has a second time diversity gain with respect to the second parities for all (or entirety) of the plurality of transmission frames.

Therefore, the BICM encoder has to perform interleaving such that the information data part included in each of the plurality of transmission frames has the first time diversity gain with respect to the first parities, and simultaneously all of the information data included in the plurality of transmission frames has the second time diversity gain with respect to the second parities for all of the plurality of transmission frames when all of the plurality of transmission frames are considered.

Referring back to FIG. 3, the BICM encoder may perform interleaving in a unit of each transmission frame so that the information data part 1 340-1 included in the transmission frame 1 320 has the first time diversity gain with respect to 1 and 2 of the first parities 350, and the information data part 2 340-2 included in the transmission frame 2 330 has the first time diversity gain to 3 and 4 of the first parities 350.

That is, the BICM encoder may perform interleaving on the information data 340 and the first parities 350 by setting each transmission frame as the first interleaving unit to obtain the first time diversity gain. Simultaneously, the BICM encoder may perform interleaving in a unit of all of the transmission frames 1 and 2 so that all of the information data 340 included in the transmission frame 1 320 and the transmission frame 2 330 has the second diversity gain with respect to the second parities 360.

That is, the BICM encoder may perform interleaving on the information data 340 and the first parities 350 by setting each of the transmission frames 1 and 2 as the first interleaving unit to obtain the first time diversity gain, and simultaneously, the BICM encoder 420 may perform interleaving the information data 340 and the second parities 360 by setting all of the transmission frames 1 and 2 as the second interleaving unit to obtain the second diversity gain.

Therefore, the first interleaving unit may be smaller than the second interleaving unit. That is, each transmission frame is set as the first interleaving unit, and the whole transmission frames are set as the second interleaving unit. Therefore, the first interleaving unit may be smaller than the second interleaving unit.

In order to perform the above interleaving, the BICM encoder 420 in FIG. 4 may include an interleaver (not shown) therein, according to an exemplary embodiment. Also, the BICM encoder 500 or 600 in FIG. 5 or 6 may include an interleaver (not shown) separate from the order rearrangement unit 520 or 620, respectively.

An example of an interleaving method performed in the BICM encoder will be described.

Figure 10:
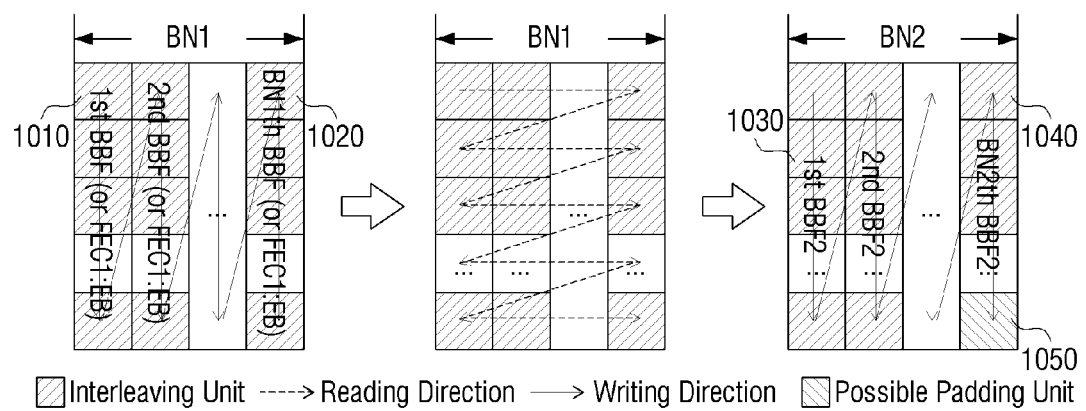
FIG. 10 is a view illustrating an interleaving method according to an exemplary embodiment.

FIG. 10 is a view illustrating an interleaving method according to an exemplary embodiment.

Referring to FIG. 10, each block is a block interleaved in a first interleaving unit, and blocks interleaved in the first interleaving unit are collected to form one baseband frame.

One baseband frame may be configured by dividing a plurality of interleaved blocks, which are interleaved in the first interleaving unit, by a second interleaving unit. Therefore, a first baseband frame 1010 to a BN1-th baseband frame 1020 are stored in a buffer from a top to a bottom and from a left column to a right column.

After the plurality of baseband frames 1010 to 1020 stored in the buffer are read out from the left to right and from a top row to a bottom row, a first baseband frame 1030 to a BN2-th baseband frame 1040 may be stored from a top to a bottom and from a left column to a right column again according to the read-out order, and a remaining space may be filled with padding units 1050.

That is, as can be seen from FIG. 10, the first interleaving unit is one block unit, and the second interleaving unit is one baseband frame unit. Therefore, it means that the first interleaving unit is smaller than the second interleaving unit.

The interleaving method is merely exemplary, and the interleaving may be performed through another interleaving method.

Figure 11:
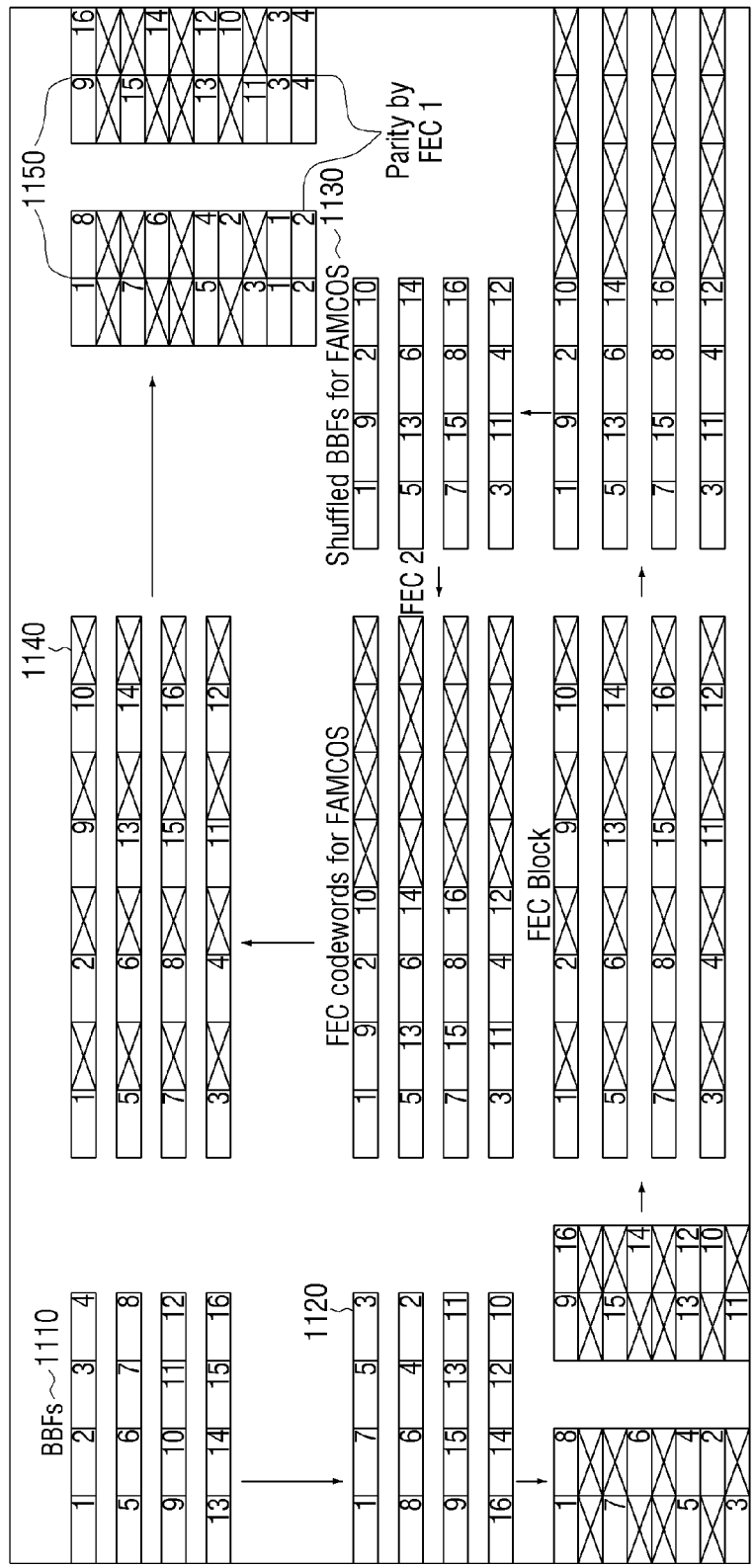
FIG. 11 is a detailed view illustrating a process of generating a plurality of transmission frames including information data, a first parity, and a second parity from a plurality of baseband frames according to an exemplary embodiment.

FIG. 11 is a detailed view illustrating a process of generating a plurality of transmission frames including information data, first parities, and second parities from a plurality of baseband frames in reference to FIGS. 3 to 5, according to an exemplary embodiment.

Referring to FIG. 11, information data 1120 is generated from the first FEC encoding on a plurality of baseband frames 1110, and the information data 1120 becomes a plurality of baseband frames 1130 according to a second FEC coding parameter for performing second FEC coding. Here, the first FEC encoding may be performed by the first FEC encoder 510.

That is, the BICM encoder 420 or 600 shown in FIG. 4 or 6 (hereinafter referred to as the BICM encoder) may generate the information data and the first parities by performing the first FEC coding on a plurality of baseband frames, and performing interleaving on a result of the first FEC coding in the first interleaving unit.

Specifically, the BICM encoder may perform the first FEC coding on the plurality of baseband frames 1110 to generate the information data 1120 and the first parities. The information data 1120 generated from the first FEC coding is illustrated in FIG. 11 without the first parities for brief description purposes.

After the BICM encoder perform the first FEC coding on the plurality of baseband frames 1110, the BICM encoder may perform interleaving on a result of the first FEC coding in a first interleaving unit. Therefore, the information data 1120, which is a result of the interleaving in the first interleaving unit, is illustrated in FIG. 11.

The BICM encoder may generate a plurality of shuffled information data by rearranging an order of the information data 1120, and may generate the second parities by performing the second FEC coding on the shuffled information data.

Specifically, the BICM encoder may map the information data 1120 generated by the first FEC coding and the interleaving in the first interleaving unit to a block for the second FEC coding and interleaving in the second interleaving unit. The BICM encoder may extract a plurality of shuffled information data, that is, the plurality of baseband frames 1130 by performing time deinterleaving, QAM demapping and bit deinterleaving. That is, the order rearrangement of information data may include the time deinterleaving, QAM demapping and bit deinterleaving.

The BICM encoder may perform the second FEC coding and interleaving on the shuffled information data and the second parities, generated from the second FEC coding, in the second interleaving unit.

That is, the BICM encoder may perform the second FEC coding on the shuffled information data to generate the second parities, and perform interleaving on the shuffled information data and the second parities in the second interleaving unit.

Subsequently, the BICM encoder may generate a plurality of transmission frames 1150 by adding the first parities to the shuffled information data 1130 and the second parities 1140 which are interleaved in the second interleaving unit. According to FIG. 11, the interleaved information data is dispersedly disposed in the plurality of transmission frames 1150, a portion of the interleaved second parities is dispersedly disposed in the interleaved information data 1-8, the other portion of the interleaved second parities is dispersedly disposed in the interleaved information data 9-16, and the first parities are added at the end of each of the transmission frames 1150 where the interleaved information data and second parities are dispersedly disposed.

Therefore, the BICM encoder may perform the first FEC coding on the plurality of baseband frames 1110 and perform the interleaving on the result of the first FEC coding in the first interleaving unit so that an information data part which is a portion of the plurality of baseband frames included in each of the plurality of transmission frames may have a first time diversity gain with respect to the first parities.

Further, after the BICM encoder performs the interleaving in the first interleaving unit, the BICM encoder may perform the order rearrangement which includes time deinterleaving, QAM demapping and bit deinterleaving. Therefore, the information data interleaved in the first interleaved unit may be restored to the information data prior to the interleaving. The restored information data is the shuffled information data.

The BICM encoder may perform the second FEC coding on the shuffled information data, and perform interleaving on the result of the second FEC result in the second interleaving unit so that the shuffled information data 1130 may have a second time diversity gain with respect to the second parities.

According to an exemplary embodiment, the plurality of transmission frames generated by the BICM encoder may include a preamble symbol which includes information about locations of the information data and the first and second parities in the plurality of transmission frames, information about the first and second FEC coding, and information about the first and second interleaving units.

Specifically, the information about locations of the information data and the first and second parities, the information about the first and second FEC coding, and the information about the first and second interleaving units in the plurality of transmission frames may be set in a signaling area of the preamble symbol, and synchronization information for allowing a frame start to be detected in a receiving apparatus (not shown) may be set in a synchronization area of the preamble symbol.

The transmitter 230 may perform an inverse fast Fourier transform (IFFT) on the plurality of transmission frames according to predetermined modulation methods and parameters (e.g. orthogonal frequency-division multiplexing (OFDM) size, guard interval (GI) size, elementary period or sampling time), convert the plurality of transmission frames to data symbols, and transmit the data symbols in an RF signal.

FIGS. 12 to 17 illustrate methods of constructing a plurality of transmission frames according to various exemplary embodiments.

Figure 12:
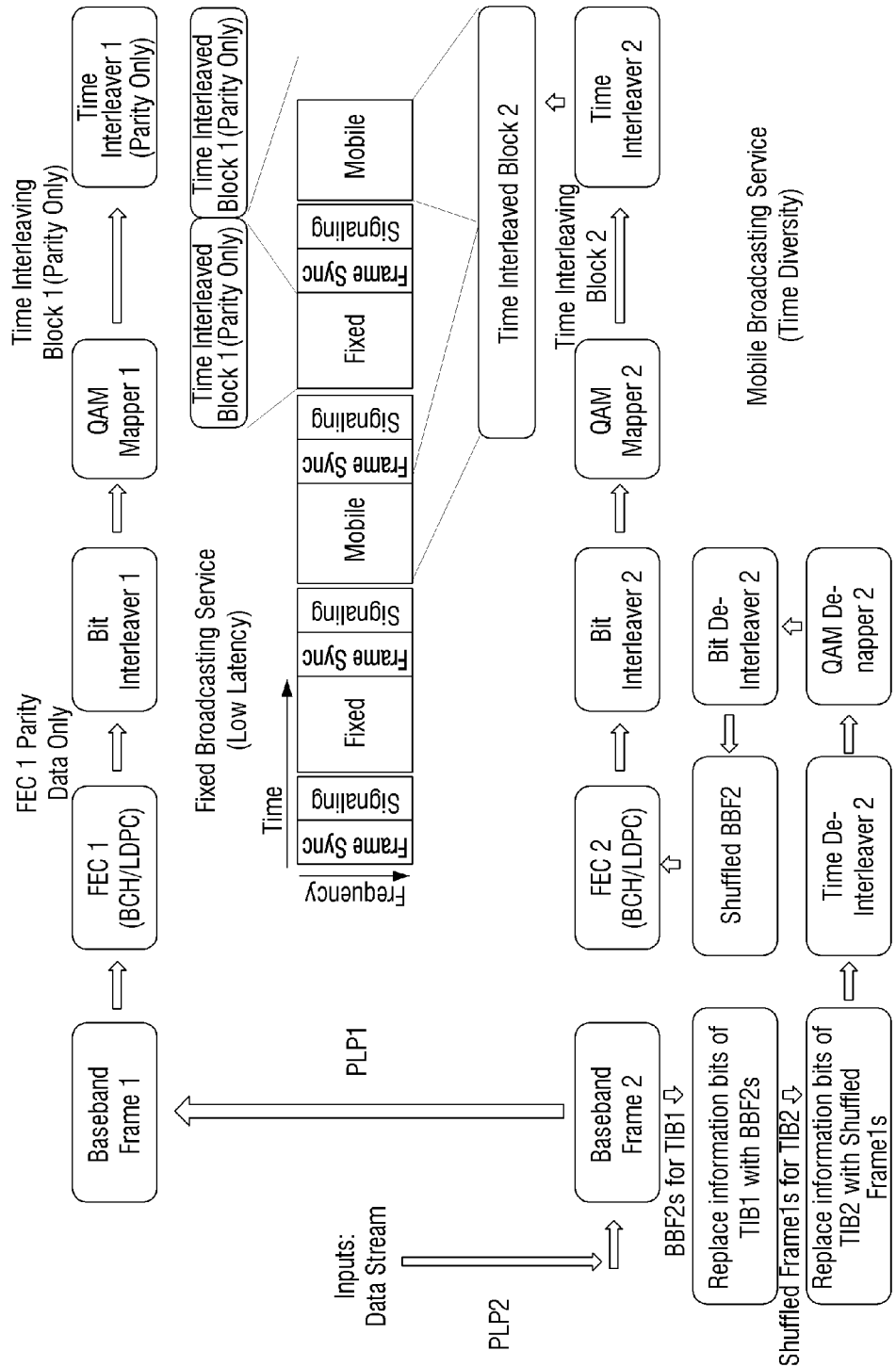
FIGS. 12 to 17 are views illustrating method of constructing a plurality of transmission frames according to various exemplary embodiments.

Referring to FIG. 12, the BICM encoder 420, 500 or 600 (hereinafter referred to as the BICM encoder) may map the information data and the second parities to a field configured to support a mobile device, and map the first parities to a field configured to support a fixed device.

Figure 13:
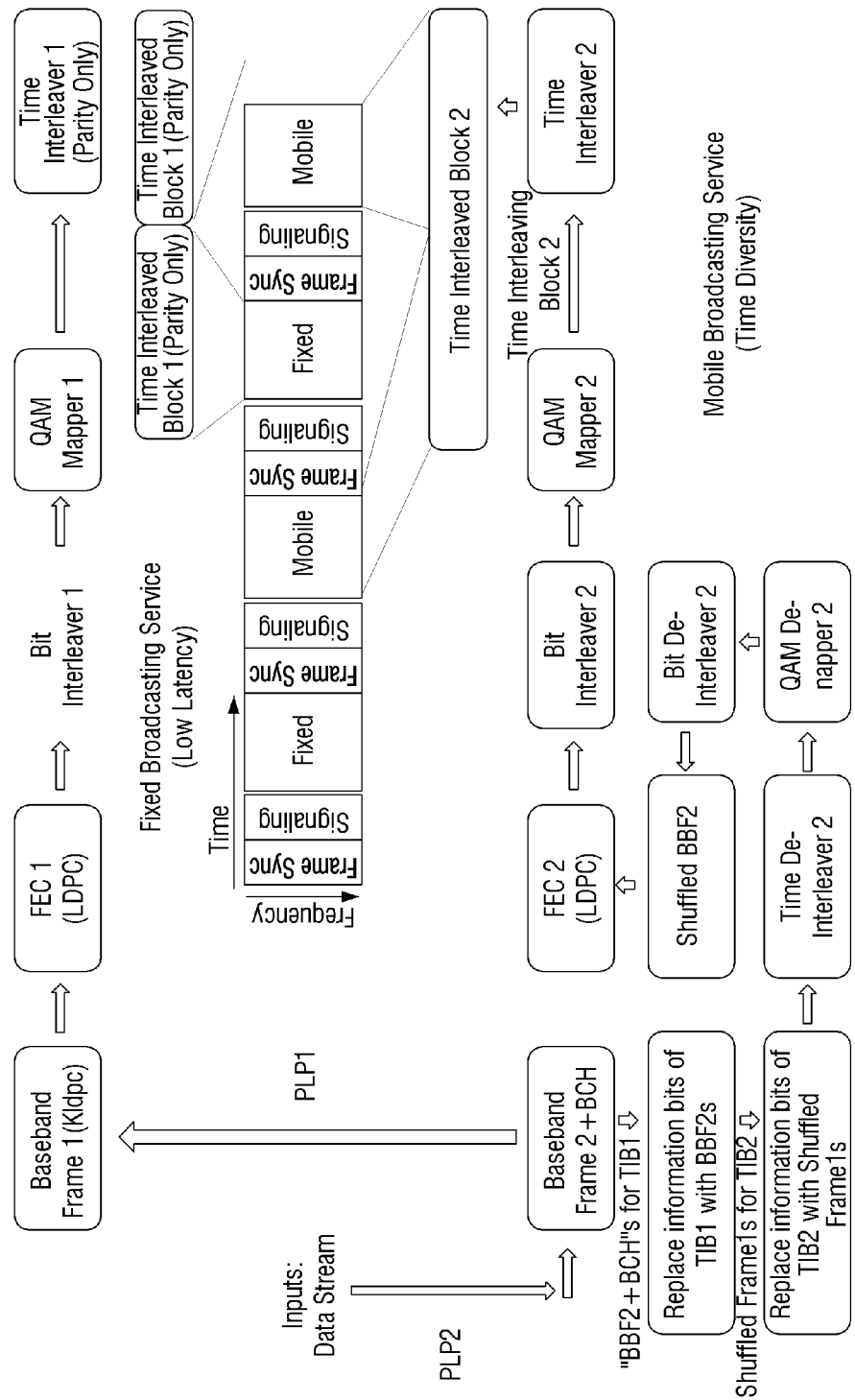

Referring to FIG. 13, the BICM encoder may first code the plurality of baseband frames with a Bose-Chaudhuri-Hocquenghem (BCH) code, and code the shuffled information data 1130 with a low-density parity-check code (LDPC). Here, each of the BCH code and the LDPC code both may be an example of an FEC code, and the coding using at least one of the BCH code and the LDPC code may be an example of FEC coding whether it is the first FEC coding or the second FEC coding. Also, the coding with the BCH coding and the coding with the LDPC coding may be referred to as an outer coding and an inner coding, respectively. Then, the BICM encoder may map the information data and the second parities to the field configured to support the mobile device, and map the first parities to the field configured to the fixed device.

The FEC code may be configured of a code having a cyclic redundancy check (CRC) function and an error correction function. Although FIG. 13 illustrates a combination of a BCH code and an LCPC, a combination of a CRC code and an LDPC, or a combination of a CRC code and a turbo code may be used, and the inventive concept is not limited to a combination of specific codes.

Figure 14:
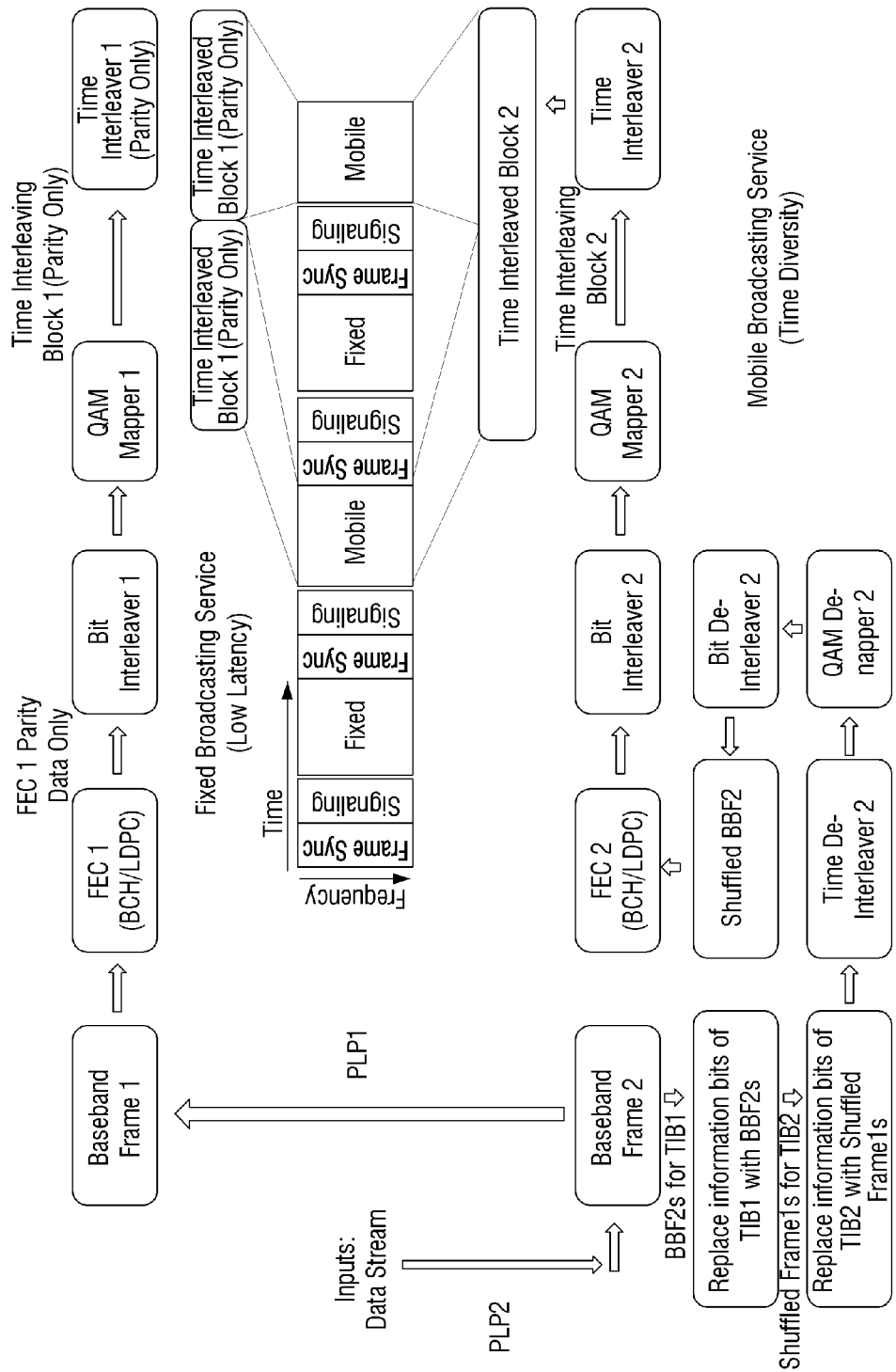

Referring to FIG. 14, the BICM encoder 420 may map all of the information data, the first parities and the second parities to the field configured to support the mobile device.

Figure 15:
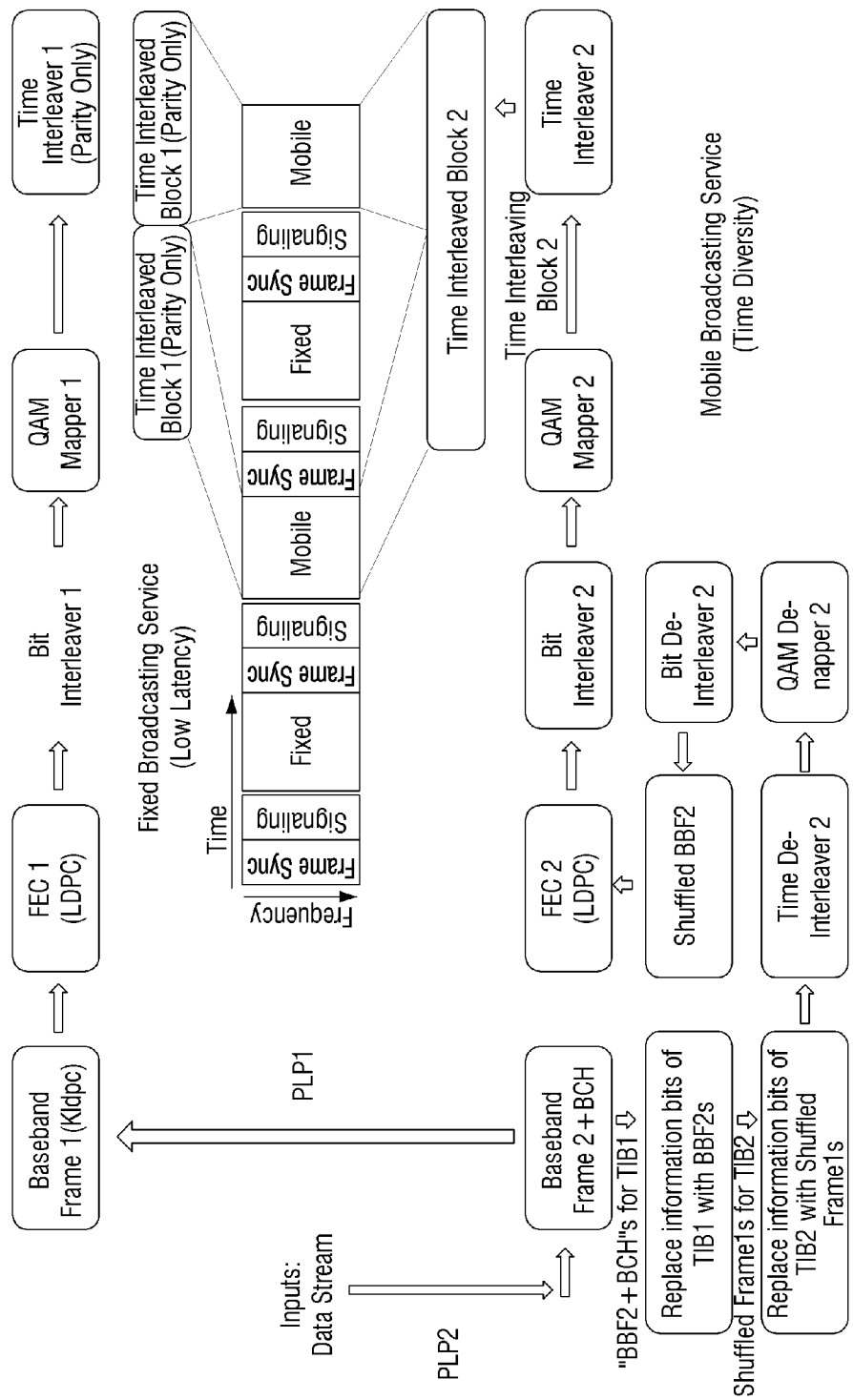

Referring to FIG. 15, the BICM encoder 420 may first code the plurality of baseband frames with a BCH code, and code the shuffled information data 1130 with an LDPC code. Then, the BICM encoder 420 may map all of the information data, the first parities and the second parities to the field configured to support the mobile device.

Figure 16:
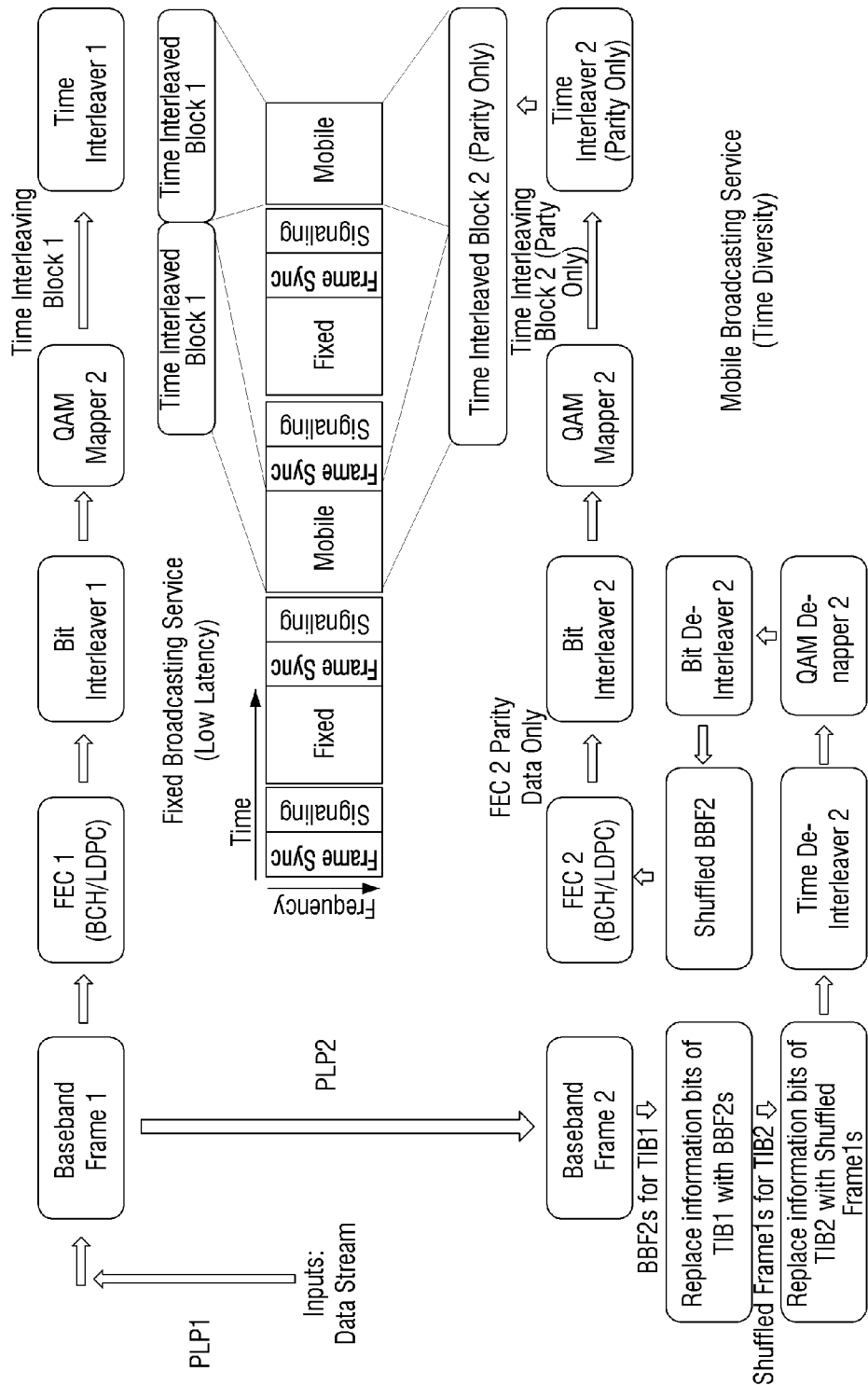
Figure 17:
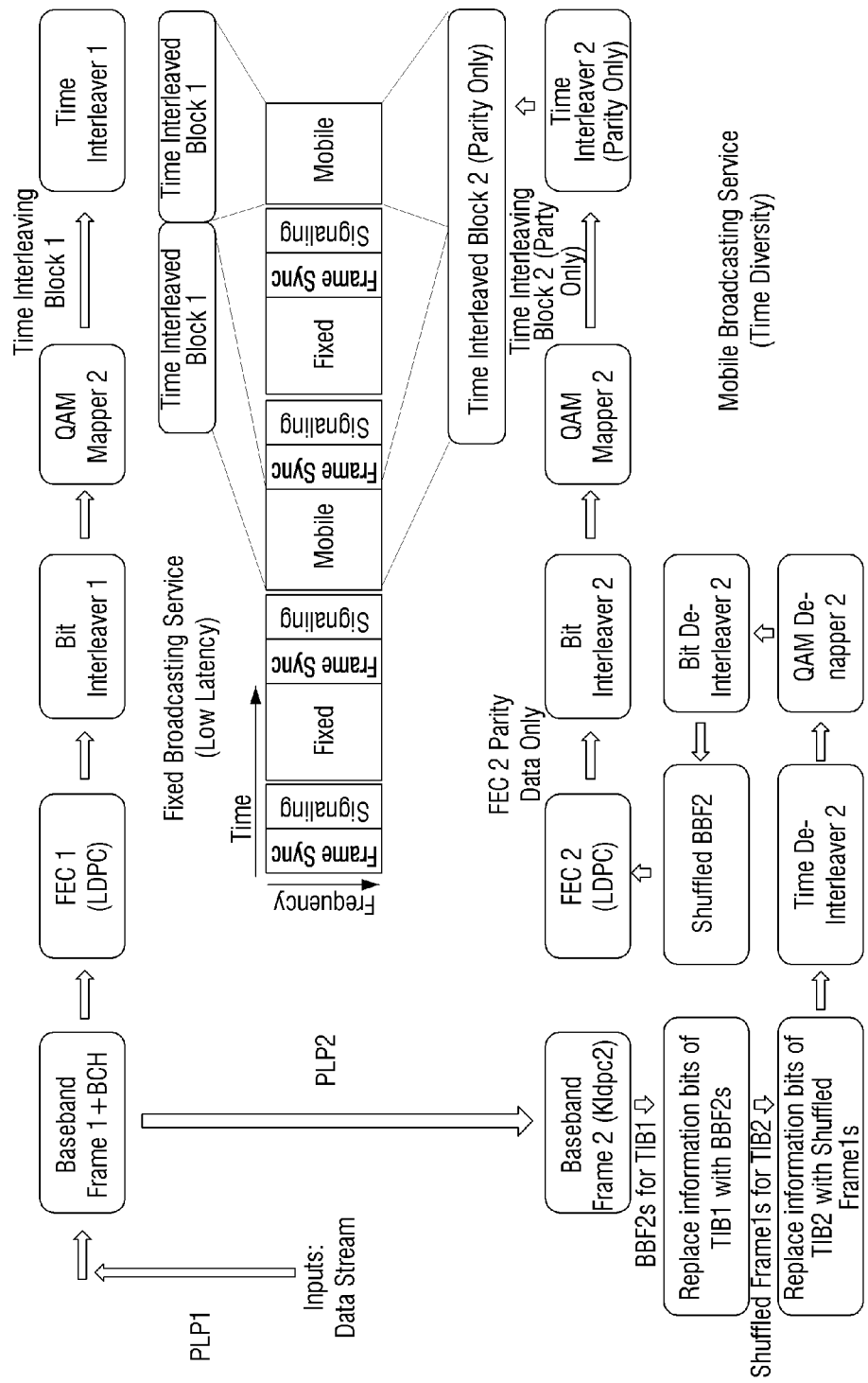

FIGS. 16 and 17 illustrate processes of mapping all of the information data, the first parities, and the second parities to the field configured to support the mobile device by the BICM encoder in a manner similar to FIGS. 14 and 15. However, the processes illustrated in FIGS. 16 and 17 are different from the processes illustrated in FIGS. 14 and 15 in that the BICM encoder maps the information data output after the first FEC coding is performed to the field configured to support the mobile device. However, since the information data output from the first FEC coding is the same as the information data output from the second FEC coding, either information data may be mapped to the field.

FIGS. 12 to 17 have described examples of constructing the plurality of transmission frames, but there are conditions commonly applied to the above-described exemplary embodiments.

The second parities are parity data for supporting the mobile device and generated to increase an interleaving unit, thereby to increase a time diversity gain by considering that a channel environment for the mobile device is relatively inferior to a channel environment for the fixed device.

Therefore, the second parities may be used only for the mobile device, and may not support the fixed device having a channel environment relatively better than the mobile device.

Accordingly, the second parities may be inserted into the field for the mobile device among the plurality of transmission frames, but the second parities may not be inserted into the field for the fixed device among the plurality of transmission frames.

Figure 18:
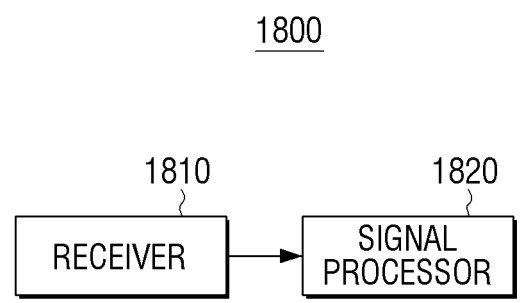
FIG. 18 is a block diagram illustrating a configuration of a receiving apparatus according to an exemplary embodiment.

FIG. 18 is a block diagram illustrating a configuration of a receiving apparatus according to an exemplary embodiment.

Referring to FIG. 18, a receiving apparatus 18 may include a receiver 1810 and a signal processor 1820.

The receiver 1810 may receive a plurality of transmission frames including a preamble symbol, information data commonly provided to the fixed device and the mobile device, first parities for the fixed device and second parities for the mobile device.

Each of the plurality of transmission frames may include the first parities corresponding to the information data part included in each of the plurality of transmission frames and a portion of the second parities corresponding to all of the information data included in the plurality of transmission frames. This has been described above, and detailed descriptions thereof will be omitted.

The information data part included in each of the plurality of transmission frames may have a first time diversity gain with respect to the first parities for each of the plurality of transmission frames, and all of the information data included in the plurality of transmission frames may have a second time diversity gain with respect to the second parities for all of the plurality of transmission frames.

The information included in the preamble symbol may include information about the first FEC coding and the second FEC coding. Here, the first FEC coding may have been performed on the plurality of transmission frames for the fixed device or the fixed device and the mobile device, and the second FEC coding may have been performed on the plurality of transmission frames only for the mobile device, Also, the information included in the preamble symbol may further include information about the first interleaving unit for obtaining the first time diversity gain and the second interleaving unit for obtaining the second time diversity gain.

The signal processor 1820 may perform signal processing on the information data using at least one of the first parities and the second parities based on the information stored in the preamble symbol.

Specifically, when the receiving apparatus is a fixed device, the signal processor 1820 may perform signal processing on each of the plurality of transmission frames using the first parities corresponding to the information data part included in each of the plurality of transmission frames. When the receiving apparatus is a mobile device, the signal processor 1820 may perform signal processing on all of the plurality of transmission frames using the second parities corresponding to all of the information data included in the plurality of transmission frames. Further, when the receiving apparatus is a mobile device, the signal processor 1820 may perform additional signal processing on each of the transmission frames using the first parities corresponding to the information data part included in each of the transmission frames based on the information included in the preamble symbol, according to another exemplary embodiment.

That is, when the receiving apparatus is a fixed device, the signal processor 1820 may perform signal processing using the first parities whenever the information data part included in each of the plurality of transmission frames is received. However, when the receiving apparatus is a mobile device, the signal processor 1820 may perform signal processing using the second parities corresponding to all of the information data included in the plurality of transmission frames after all of the information data included in the transmission frames have been received, that is, when reception of all of the information data included in the transmission frames is completed.

Therefore, even when the fixed device receives the same data as received in the mobile device, the fixed device may perform signal processing on this data with a small delay in deinterleaving, and generate the signal-processed data. The mobile device may maximize the time diversity gain to overcome the channel environment relatively inferior to the channel environment for the fixed device, and then the fixed device may receive the same data as received in the mobile device, perform signal processing on the data, and generate the signal-processed data, Hereinafter, a signal processing process of the signal processor will be described in detail. When the receiving apparatus is a fixed device, the signal processor 1820 may perform deinterleaving on the information data part included in each of the plurality of transmission frames based on the information about the first interleaving unit, and decode the deinterleaved information data part based on the information about the first FEC coding and the first parities.

When the receiving apparatus is the mobile device, the signal processor 1820 may perform deinterleaving on all of the information data included in the plurality of transmission frames based on the information about the second interleaving unit, and decode the deinterleaved information data based on the information about the second FEC coding and the second parities. Further, the signal processor 1820 may perform deinterleaving on the information data part included in each of the plurality of transmission frames based on the information about the first interleaving unit, and decode the deinterleaved information data part based on the information about the first FEC coding and the first parities.

The first interleaving unit has to be set smaller than the second interleaving unit. Since the fixed device does not need to have a large time diversity gain that is required for the mobile device, a delay in deinterleaving in the fixed device may be reduced. The mobile device needs to have a large time diversity gain.

Figure 19:
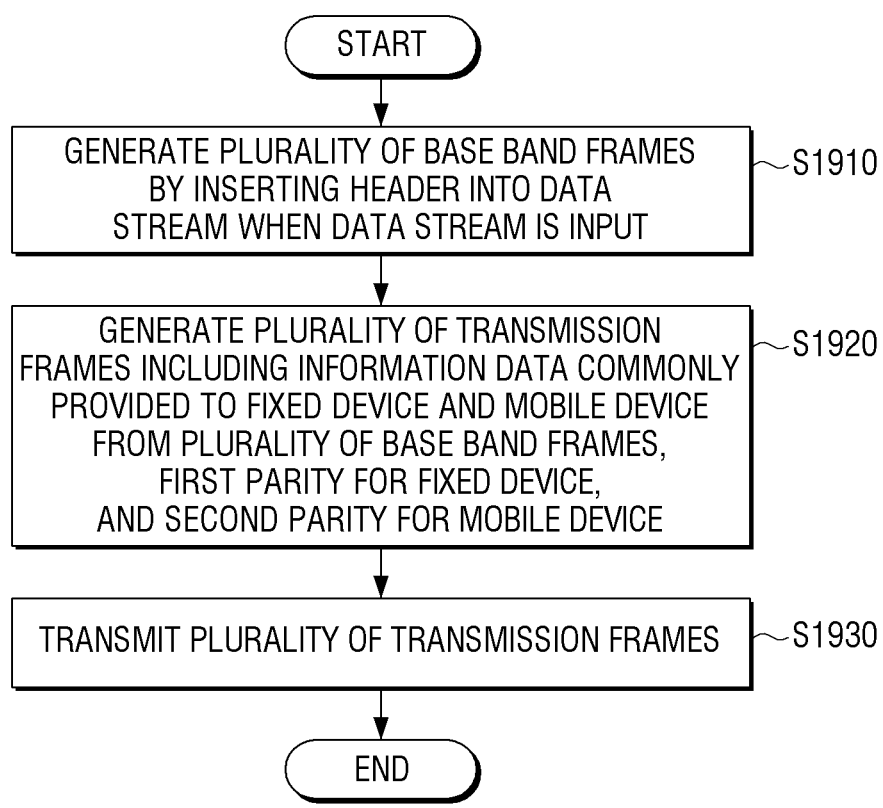
FIG. 19 is a flowchart illustrating a method of controlling a transmitting apparatus according to an exemplary embodiment.

FIG. 19 is a flowchart illustrating a control method of a transmitting apparatus according to an exemplary embodiment.

According to the control method as illustrated in FIG. 19, when a data stream is input, the transmitting apparatus may generate a plurality of baseband frames by inserting a header into the data stream (S1910).

The transmitting apparatus may generate a plurality of transmission frames including information data commonly provided to a fixed device and a mobile device, first parities for the fixed device, and second parities for the mobile device from the plurality of baseband frames (S1920).

The plurality of baseband frames may include the first parities corresponding to an information data part included in each of a plurality of transmission frames, and a portion of the second parities corresponding to all of the information data included in the plurality of transmission frames.

The transmitting apparatus may transmit the plurality of transmission frames (S1930).

The information data part included in each of the plurality of transmission frames may have a first time diversity gain with respect to the first parities for each of the plurality of transmission frames, and all of the information data included in the plurality of transmission frames may have a second time diversity gain with respect to the second parities for all of the plurality of transmission frames.

Operation S1920 illustrated in FIG. 19 may further include performing first FEC encoding for the fixed device or the first device and the mobile device, and second FEC encoding for the mobile device, on the plurality of baseband frames, and perform interleaving a result of the first and/or second FEC coding to generate the plurality of transmission frames which include the information data, the first parities, and the second parities.

Specifically, operation S1920 may include performing interleaving on the plurality of baseband frames, on which the first FEC coding and the second FEC coding are performed, by considering both the first time interleaving unit for obtaining the first time diversity gain and the second time interleaving unit for obtaining the second time diversity gain. The first interleaving unit may be smaller than the second interleaving unit More specifically, operation S1920 may include generating the information data and the first parities by performing the first FEC coding on the plurality of baseband frames, performing interleaving on a result of the first FEC coding in the first interleaving unit, generating a plurality of shuffled information data by rearranging an order of the information data, generating the second parities by performing the second FEC coding on the plurality of shuffled information data, and performing interleaving on the plurality of shuffled information data and the second parities.

The plurality of transmission frames generated at operation S1930 may include a preamble symbol including information about locations of the information data, the first parities, and the second parities in the plurality of transmission frames, information about the first FEC coding and the second FEC coding, and information about the first and second interleaving units.

Figure 20:
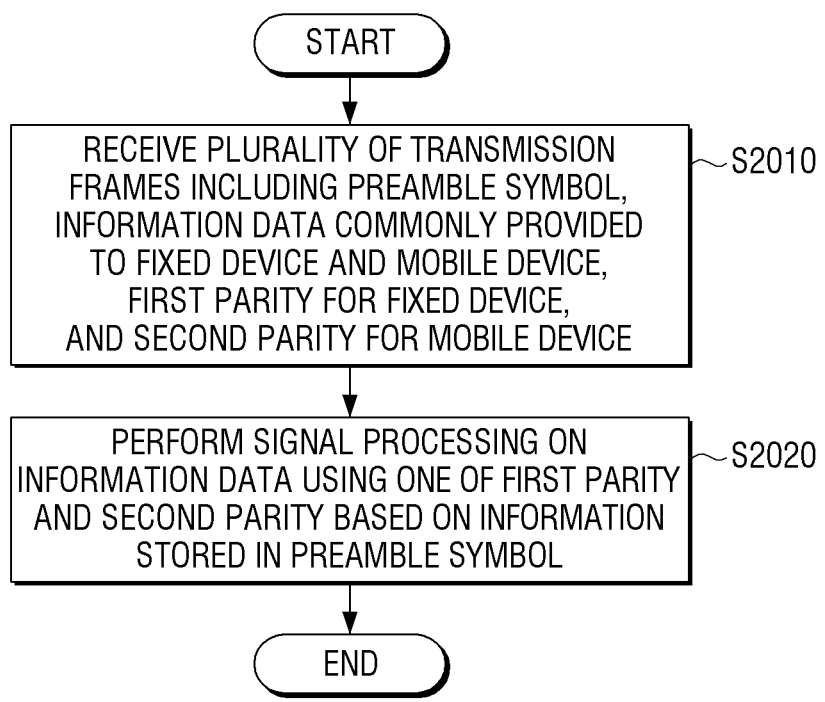
FIG. 20 is a flowchart illustrating a method of controlling a receiving apparatus according to an exemplary embodiment.

FIG. 20 is a flowchart illustrating a control method of a receiving apparatus according to an exemplary embodiment.

According to the control method illustrated in FIG. 20, the receiving apparatus may receive a plurality of transmission frames including a preamble symbol, information data commonly provided to a fixed device and a mobile device, first parities for the fixed device or the fixed device and the mobile device, and second parities for the mobile device (S2010). Here, the first parities and second parities may have been generated only for the fixed device and the mobile device, respectively.

The receiving apparatus may perform signal processing on the information data using at least one of the first parities and the second parities based on information stored in the preamble symbol (S2020).

Each of the plurality of transmission frames may include the first parities corresponding to an information data part included in each of the plurality of transmission frames and a portion of the second parities corresponding to all of information data included in the plurality of transmission frames.

The information data part included in each of the plurality of transmission frames may have a first time diversity gain with respect to the first parities for each of the plurality of transmission frames, and may have a second time diversity gain with respect to the second parities for all of the plurality of transmission frames.

The information stored in the preamble symbol may include information about the first FEC coding for the fixed device or both the fixed device and the mobile device, and the second FEC coding for the mobile device, with respect to the plurality of transmission frames, and information about the first interleaving unit for obtaining the first time diversity gain and the second interleaving unit for obtaining the second time diversity gain.

Operation S2020 illustrated in FIG. 20 may include performing signal processing on each of the plurality of transmission frames using the first parities corresponding to the information data part included in each of the plurality of transmission frames when the receiving apparatus is the fixed device, and performing signal processing on all of the plurality of transmission frames using the second parities corresponding to all of the information data included in the plurality of transmission frames when the receiving apparatus is a mobile device. According to another exemplary embodiment, when the receiving apparatus is the mobile device, the signal processing performed for the fixed device (i.e., signal processing on each of the plurality of transmission frames using the first parities corresponding to the information data part included in each of the plurality of transmission frames) may be performed after performing the signal processing on all of the plurality of transmission frames using the second parities corresponding to all of the information data included in the plurality of transmission frames.

Specifically, operation S2020 may include performing deinterleaving on the information data part included in each of the plurality of transmission frames based on information about the first interleaving unit, and decoding the deinterleaved information data part based on the information about the first FEC decoding and the first parities when the receiving apparatus is the fixed device.

Operation S2020 may further include performing deinterleaving on all of the information data included in the plurality of transmission frames based on the information about the second interleaving unit, and decoding the deinterleaved information data based on the information about the second FEC coding and the second parities, when the receiving apparatus is the mobile device. According to another exemplary embodiment, when the receiving apparatus is the mobile device, the deinterleaving and decoding performed for the fixed device (i.e., deinterleaving on the information data part included in each of the plurality of transmission frames based on information about the first interleaving unit and decoding the deinterleaved information data part based on the information about the first FEC decoding and the first parities) may be performed after deinterleaving on all of the information data included in the plurality of transmission frames based on the information about the second interleaving unit and decoding the deinterleaved information data based on the information about the second FEC coding and the second parities.

A non-transitory computer-recordable medium in which a program performing the control methods according to the above-described exemplary embodiments is stored may be provided, according to an exemplary embodiment.

The non-transitory computer-recordable medium is not a medium configured to temporarily store data such as a register, a cache, or a memory but an apparatus-readable medium configured to semi-permanently store data. Specifically, the above-described various applications or programs may be stored in the non-transitory apparatus-readable medium such as a compact disc (CD), a digital versatile disc (DVD), a hard disc, a Blu-ray disc, a universal serial bus (USB), a memory card, or a read only memory (ROM), and provided.

Components, elements or units represented by a block to constitute the transmitting apparatuses of FIGS. 2 and 4, the receiving apparatus of FIG. 18, and the BICM encoders in FIGS. 5 and 6 in the above exemplary embodiments may be embodied as a various number of hardware, software and/or firmware structures that execute respective operations or functions described above, according to exemplary embodiments. For example, these components, elements or units may use a direct circuit structure, such as a memory, processing, logic, a look-up table, etc. that may execute the respective functions through controls of one or more microprocessors or other control apparatuses. These components, elements or units may be specifically embodied by a module, a program, or a part of code, which contains one or more executable instructions for performing specified logic functions. Although buses are not illustrated in the block diagrams illustrating the transmitting apparatuses, the receiving apparatus and the BICM encoders, communication between the components, elements or units included therein may be performed through the buses. A processor such as a central processing unit (CPU), or a microprocessor configured to perform the above-described various operations may be further included therein.

The foregoing exemplary embodiments and advantages are merely exemplary and are not to be construed as limiting the present inventive concept. The exemplary embodiments can be readily applied to other types of devices. Also, the description of the exemplary embodiments is intended to be illustrative, and not to limit the scope of the claims, and many alternatives, modifications, and variations will be apparent to those skilled in the art.

What is claimed is:

1. A transmitting apparatus comprising:
   a stream processor configured to generate a plurality of baseband frames;

a frame generator configured to generate, from the plurality of baseband frames, a plurality of transmission frames; and a transmitter configured to transmit the plurality of transmission frames, wherein the plurality of transmission frames comprise information data commonly provided to a fixed device and a mobile device, first parities to be used for signal processing at the fixed device, and second parities to be used for signal processing at the mobile device, wherein the first parities are generated by encoding a portion of the information data included in each of the plurality of transmission frames, and the second parities are generated by encoding an entirety of the information data included in the plurality of transmission frames, wherein the first parities are included in each of the plurality of transmission frames, and wherein each of portions of the second parities is respectively included in the plurality of transmission frames.

2. The transmitting apparatus of claim 1, wherein the first parities are added to an end of each of the plurality of transmission frames, and each of the portions of the second parities is dispersedly included in each portion of the information data included in each of the plurality of transmission frames.

3. The transmitting apparatus of claim 2, wherein the frame generator comprises a bit interleaved coded modulation (BICM) encoder, and wherein the BICM encoder is configured to generate the information data, the first parities and the second parities by performing first forward error correction (FEC) coding on the plurality of baseband frames, first interleaving on a signal output from the first FEC coding, second FEC coding on a signal output from the first interleaving, and performing second interleaving on a signal output from the second FEC coding.

4. The transmitting apparatus of claim 3, wherein the BICM encoder is configured to perform the first interleaving in a first interleaving unit of the signal output from the first FEC coding and perform the second interleaving in a second interleaving unit of the signal output from the second FEC coding, and wherein the first interleaving unit is smaller than the second interleaving unit.

5. The transmitting apparatus of claim 4, wherein the first interleaving unit is a size of one transmission frame, and the second interleaving unit is a size of the entirety of the plurality of transmission frames.

6. The transmitting apparatus of claim 1, wherein the frame generator comprises a bit interleaved coded modulation (BICM) encoder, and wherein the BICM encoder is configured to perform first forward error correction (FEC) coding on the plurality of baseband frames to generate the information data and the first parities, interleave a signal output from the first FEC coding including the information data and the first parities in a first interleaving unit, rearrange an order of the interleaved information data to generate shuffled information data, perform second FEC coding on the shuffled information data to generate the second parities, and interleave a signal output from the second FEC coding including the shuffled information data and the second parities in a second interleaving unit.

7. A receiving apparatus comprising:
a receiver configured to receive a plurality of transmission frames, the plurality of transmission frames comprising information data commonly provided to a fixed device and a mobile device, first parities to be used for signal processing at the fixed device, and second parities to be used for signal processing at the mobile device; and a signal processor configured to perform signal processing on the plurality of transmission frames using the first parities or the second parities, wherein the first parities are generated by encoding a portion of the information data included in each of the plurality of transmission frames, and the second parities are generated by encoding an entirety of the information data included in the plurality of transmission frames, wherein the first parities are included in each of the plurality of transmission frames, and wherein each of portions of the second parities is respectively included in the plurality of transmission frames.

8. The receiving apparatus of claim 7, wherein, for the signal processing, the signal processor is configured to use the first parities to decode the plurality of transmission frames in a unit of one transmission frame, and use the second parities to decode the plurality of transmission frames in a unit of the entirety of the plurality of transmission frames.

9. The receiving apparatus of claim 8, wherein the first parities are added to an end of each of the plurality of transmission frames, and each of the portions of the second parities is dispersedly included in each portion of the information data included in each of the plurality of transmission frames.

10. The receiving apparatus of claim 7, wherein, if the receiving apparatus is the fixed device, the signal processor is configured to perform signal processing on each of the plurality of transmission frames using the first parities generated with respect to the information data included in each of the plurality of transmission frames, and wherein, if the receiving apparatus is the mobile device, the signal processor is configured to perform signal processing on the plurality of transmission frames using the second parities generated with respect to the entirety of the information data included in the plurality of transmission frames.

11. A method of controlling a transmitting apparatus, the method comprising:
generating a plurality of baseband frames;
generating, from the plurality of baseband frames, a plurality of transmission frames; and
transmitting the plurality of transmission frames,
wherein the plurality of transmission frames comprise information data commonly provided to a fixed device and a mobile device, first parities to be used for signal processing at the fixed device, and second parities to be used for signal processing at the mobile device,
wherein the first parities are generated by encoding a portion of the information data included in each of the plurality of transmission frames, and the second parities are generated by encoding an entirety of the information data included in the plurality of transmission frames,
wherein the first parities are included in each of the plurality of transmission frames, and
wherein each of portions of the second parities is respectively included in the plurality of transmission frames.

12. The method of claim 11, wherein the first parities are added to an end of each of the plurality of transmission frames, and each of the portions of the second parities is dispersedly included in each portion of the information data included in each of the plurality of transmission frames.

13. The method of claim 12, wherein the information data, the first parities and the second parities are generated by performing first forward error correction (FEC) coding on the plurality of baseband frames, first interleaving on a signal output from the first FEC coding, second FEC coding on a signal output from the first interleaving, and performing second interleaving on a signal output from the second FEC coding.

14. The method of claim 13, wherein the first interleaving is performed in a first interleaving unit of the signal output from the first FEC coding and a second interleaving unit of the signal output from the second FEC coding, and
    wherein the first interleaving unit is smaller than the second interleaving unit.

15. The method of claim 14, wherein the first interleaving unit is a size of one transmission frame, and the second interleaving unit is a size of the entirety of the plurality of transmission frames.

16. The method of claim 11, wherein the generating the plurality of transmission frames comprises:
    performing first forward error correction (FEC) coding on the plurality of baseband frames to generate the information data and the first parities;
    interleaving a signal output from the first FEC coding including the information data and the first parities in a first interleaving unit;
    rearranging an order of the interleaved information data to generate shuffled information data;
    performing second FEC coding on the shuffled information data to generate the second parities; and
    interleaving a signal output from of the second FEC coding including the shuffled information data and the second parities in a second interleaving unit.

17. A method of controlling a receiving apparatus, the method comprising:
    receiving a plurality of transmission frames, the plurality of transmission frames comprising information data commonly provided to a fixed device and a mobile device, first parities to be used for signal processing at the fixed device, and second parities to be used for signal processing at only the mobile device among the fixed device and the mobile device; and
    performing signal processing on the plurality of transmission frames using the first parities or the second parities,
    wherein the first parities are generated by encoding a portion of the information data included in each of the plurality of transmission frames, and the second parities are generated by encoding an entirety of the information data included in the plurality of transmission frames,
    wherein the first parities are included in each of the plurality of transmission frames, and
    wherein each of portions of the second parities is respectively included in the plurality of transmission frames.

18. The method of claim 17, wherein, in the signal processing, the first parities are used to decode the plurality of transmission frames in a unit of one transmission frame, and the second parities are used to decode the plurality of transmission frames in a unit of the entirety of the plurality of transmission frames.

19. The method of claim 18, wherein
    the first parities are added to an end of each of the plurality of transmission frames, and each of the portions of the second parities is dispersedly included in each portion of the information data included in each of the plurality of transmission frames.

20. The method of claim 17, wherein the performing signal processing on the plurality of transmission frames comprises:
    performing signal processing on each of the plurality of transmission frames using the first parities generated with respect to the information data part included in each of the plurality of transmission frames, if the receiving apparatus is the fixed device; and
    performing signal processing on the entirety of the plurality of transmission frames using the second parities generated with respect to the entirety of the information data included in the plurality of transmission frames, if the receiving apparatus is the mobile device.

* * * * *